(12) United States Patent
Lim et al.

(10) Patent No.: US 12,002,511 B2
(45) Date of Patent: Jun. 4, 2024

(54) SEMICONDUCTOR DEVICES AND ELECTRONIC SYSTEMS INCLUDING THE SAME

(71) Applicant: Samsung Electronics Co., Ltd., Suwon-si (KR)

(72) Inventors: Geunwon Lim, Yongin-si (KR); Jinwoo Park, Gunpo-si (KR); Ilgyu Choi, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 394 days.

(21) Appl. No.: 17/353,918

(22) Filed: Jun. 22, 2021

(65) Prior Publication Data

US 2022/0139456 A1    May 5, 2022

(30) Foreign Application Priority Data

Nov. 4, 2020 (KR) .................. 10-2020-0146317

(51) Int. Cl.
| | |
|---|---|
| H10B 41/10 | (2023.01) |
| G11C 16/04 | (2006.01) |
| H10B 41/20 | (2023.01) |
| H10B 41/27 | (2023.01) |
| H10B 41/35 | (2023.01) |
| H10B 41/41 | (2023.01) |
| H10B 43/10 | (2023.01) |
| H10B 43/20 | (2023.01) |
| H10B 43/27 | (2023.01) |

(Continued)

(52) U.S. Cl.
CPC ......... *G11C 16/0483* (2013.01); *H10B 41/10* (2023.02); *H10B 41/20* (2023.02); *H10B 41/27* (2023.02); *H10B 41/35* (2023.02); *H10B 41/41* (2023.02); *H10B 43/10* (2023.02); *H10B 43/20* (2023.02); *H10B 43/27* (2023.02); *H10B 43/35* (2023.02); *H10B 43/40* (2023.02)

(58) Field of Classification Search
CPC ......... H01L 41/10; H01L 41/20; H01L 41/27; H01L 43/10; H01L 43/20; H01L 43/27
See application file for complete search history.

(56) References Cited

U.S. PATENT DOCUMENTS

| | | |
|---|---|---|
| 7,608,195 B2 | 10/2009 | Wilson |
| 10,355,016 B2 | 7/2019 | Lee et al. |
| (Continued) | | |

OTHER PUBLICATIONS

Jiang et al. "Buckling of thin gel strip under swelling" Theoretical & Applied Mechanics Letters 7:134-137 (2017).

*Primary Examiner* — David A Zarneke
(74) *Attorney, Agent, or Firm* — Myers Bigel, P.A.

(57) ABSTRACT

Semiconductor devices may include a peripheral circuit structure including circuits, a substrate on the peripheral circuit structure, a pair of word line cut structures extending in a first direction on the substrate, and a memory cell block between the pair of word line cut structures and on the substrate. The memory cell block may include a memory stack structure including gate lines overlapping each other in a vertical direction, an interlayer insulation layer on an edge portion of each of the gate lines, a dam structure extending through the gate lines and the interlayer insulation layer, an intersection direction cut structure extending through the memory stack structure and the interlayer insulation layer in the vertical direction and being spaced apart from the dam structure, and a dummy channel structures between the intersection direction cut structure and the dam structure.

20 Claims, 33 Drawing Sheets

(51) Int. Cl.
*H10B 43/35* (2023.01)
*H10B 43/40* (2023.01)

(56) References Cited

U.S. PATENT DOCUMENTS

| | | |
|---|---|---|
| 10,381,371 B2 | 8/2019 | Ogawa et al. |
| 10,573,657 B2 | 2/2020 | Baek et al. |
| 10,665,606 B2 | 5/2020 | Baek et al. |
| 2019/0081053 A1 | 3/2019 | Nojima et al. |
| 2019/0214404 A1 | 7/2019 | Ahn et al. |

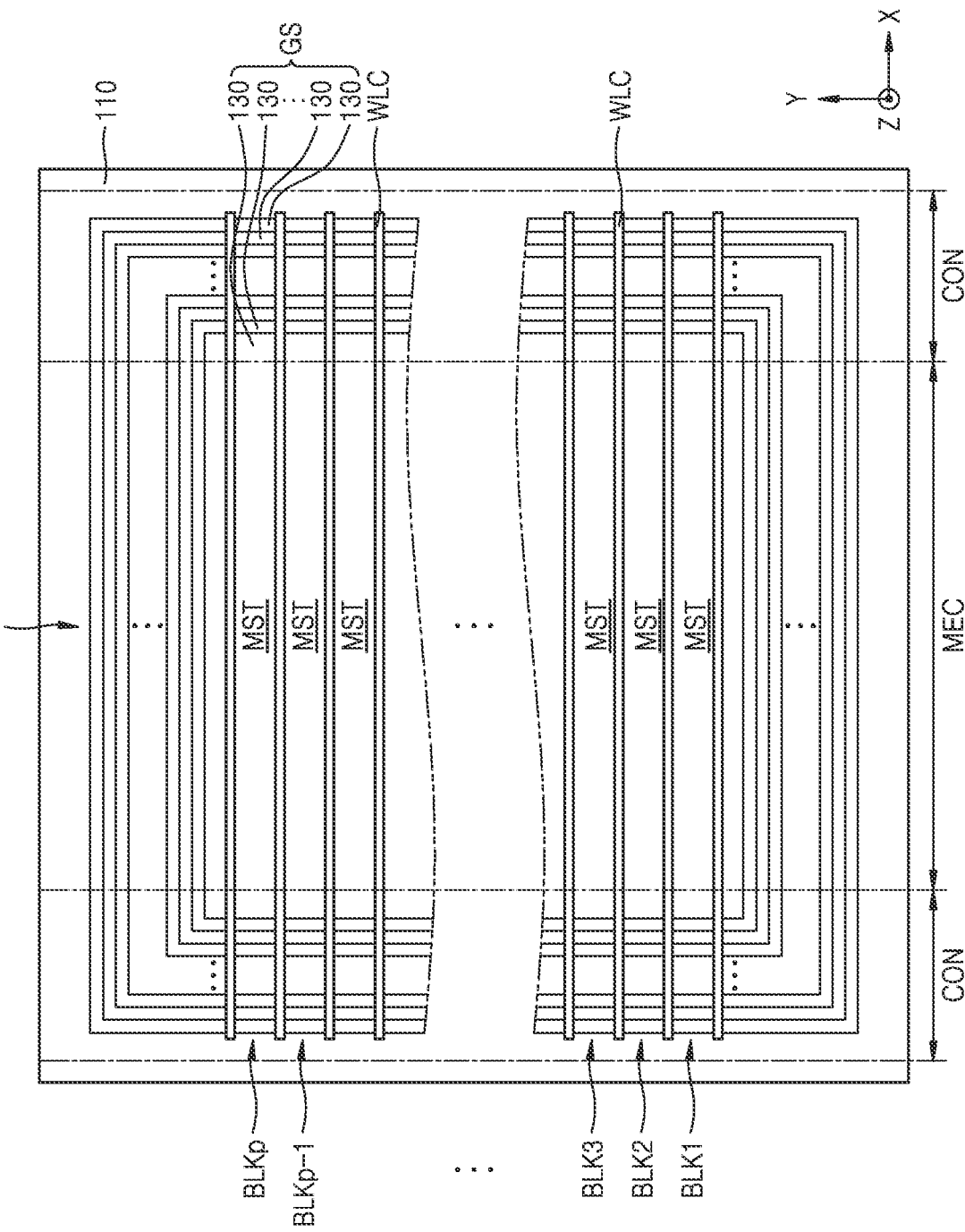

SEMICONDUCTOR DEVICES AND ELECTRONIC SYSTEMS INCLUDING THE SAME

CROSS-REFERENCE TO RELATED APPLICATION

This application is based on and claims priority under 35 U.S.C. § 119 to Korean Patent Application No. 10-2020-0146317, filed on Nov. 4, 2020, in the Korean Intellectual Property Office, the disclosure of which is incorporated by reference herein in its entirety.

BACKGROUND

The inventive concept relates to a semiconductor device and an electronic system including the same, and more particularly, to a semiconductor device including a non-volatile vertical memory device and an electronic system including the semiconductor device.

Electronic systems requiring data storage may include semiconductor devices for storing a large amount of data. Therefore, methods of increasing the data storage capacity of semiconductor devices are being researched. For example, in order to increase the data storage capacity of semiconductor devices, semiconductor devices including vertical memory devices, which include three-dimensionally arranged memory cells instead of two-dimensionally arranged memory cells, have been proposed.

SUMMARY

The inventive concept provides semiconductor devices in which leaning or falling down of a memory stack structure may be reduced or prevented even when the number of word line stacks increases for enhancing the degree of integration in the semiconductor devices including three-dimensionally arranged memory cells and thus a height of a word line stack increases, thereby reducing or preventing a process defect and enhancing reliability in a process of manufacturing the semiconductor devices.

The inventive concept provides electronic systems including a semiconductor device in which leaning or falling down of a memory stack structure may be reduced or prevented even when the number of word line stacks increases for enhancing the degree of integration in the semiconductor device including three-dimensionally arranged memory cells and thus a height of a word line stack increases, thereby reducing or preventing a process defect and enhancing reliability in a process of manufacturing the semiconductor device.

According to some embodiments of the inventive concept, there are provided semiconductor devices including a peripheral circuit structure including a plurality of circuits, a substrate on (e.g., covering) the peripheral circuit structure, a pair of word line cut structures extending longitudinally in a first horizontal direction on the substrate, the pair of word line cut structures being spaced apart from each other in a second horizontal direction that may be perpendicular to the first horizontal direction, and a memory cell block that is between the pair of word line cut structures and on the substrate, wherein the memory cell block includes a memory stack structure including a plurality of gate lines overlapping each other in a vertical direction, an interlayer insulation layer on (e.g., covering) an edge portion of each of the plurality of gate lines, a dam structure extending through the memory stack structure (e.g., the plurality of gate lines) and the interlayer insulation layer, an intersection direction cut structure extending through the memory stack structure and the interlayer insulation layer in the vertical direction and extending longitudinally in a horizontal direction traversing or intersecting with the first horizontal direction, the intersection direction cut structure being spaced apart from the dam structure in the first horizontal direction, and a plurality of dummy channel structures between the intersection direction cut structure and the dam structure.

According to some embodiments of the inventive concept, there are provided semiconductor devices including a peripheral circuit structure including a plurality of circuits, a memory stack structure including a plurality of gate lines overlapping the peripheral circuit structure in a vertical direction, an interlayer insulation layer on (e.g., covering) an edge portion of each of the plurality of gate lines, a dam structure extending through the memory stack structure (e.g., the plurality of gate lines) and the interlayer insulation layer in the vertical direction, and defining a through via region in the memory stack structure, an intersection direction cut structure extending through the memory stack structure and the interlayer insulation layer in the vertical direction, the intersection direction cut structure being spaced apart from the dam structure in a first horizontal direction and extending longitudinally in a second horizontal direction that traverses or intersects with the first horizontal direction, and a plurality of dummy channel structures between the intersection direction cut structure and the dam structure.

According to some embodiments of the inventive concept, there is provided an electronic system including a main substrate, a semiconductor device on the main substrate, and a controller electrically connected to the semiconductor device, on the main substrate, wherein the semiconductor device includes a peripheral circuit structure including a plurality of circuits, a memory stack structure including a plurality of gate lines overlapping the peripheral circuit structure in a vertical direction, an interlayer insulation layer on (e.g., covering) an edge portion of each of the plurality of gate lines, a dam structure extending through the plurality of gate lines and the interlayer insulation layer in the vertical direction, and defining a through via region in the memory stack structure, an intersection direction cut structure extending through the memory stack structure and the interlayer insulation layer in the vertical direction, the intersection direction cut structure being spaced apart from the dam structure in a first horizontal direction and extending longitudinally in a second horizontal direction traversing or intersecting with the first horizontal direction, a plurality of dummy channel structures between the intersection direction cut structure and the dam structure, and an input/output pad electrically connected to the peripheral circuit structure.

BRIEF DESCRIPTION OF THE DRAWINGS

Example embodiments of the inventive concept will be more clearly understood from the following detailed description taken in conjunction with the accompanying drawings in which:

FIG. 4 is a schematic plan view of a partial region of a semiconductor device according to some embodiments of the inventive concept;

FIGS. 13A, 14A, 15A, 16A, 17A and 18A are cross-sectional views taken along the line X1-X1' of FIG. 5A;

FIGS. 13B, 14B, 15B, 16B, 17B and 18B are cross-sectional views taken along the line Y1-Y1' of FIG. 5A;

DETAILED DESCRIPTION

Hereinafter, example embodiments of the inventive concept will be described in detail with reference to the accompanying drawings. Like numeral references refer to like elements, and their repetitive descriptions may be omitted. As used herein, an element or region that is "covering" or "surrounding" or "filling" another element or region may completely or partially cover or surround or fill the other element or region.

Figure 1:
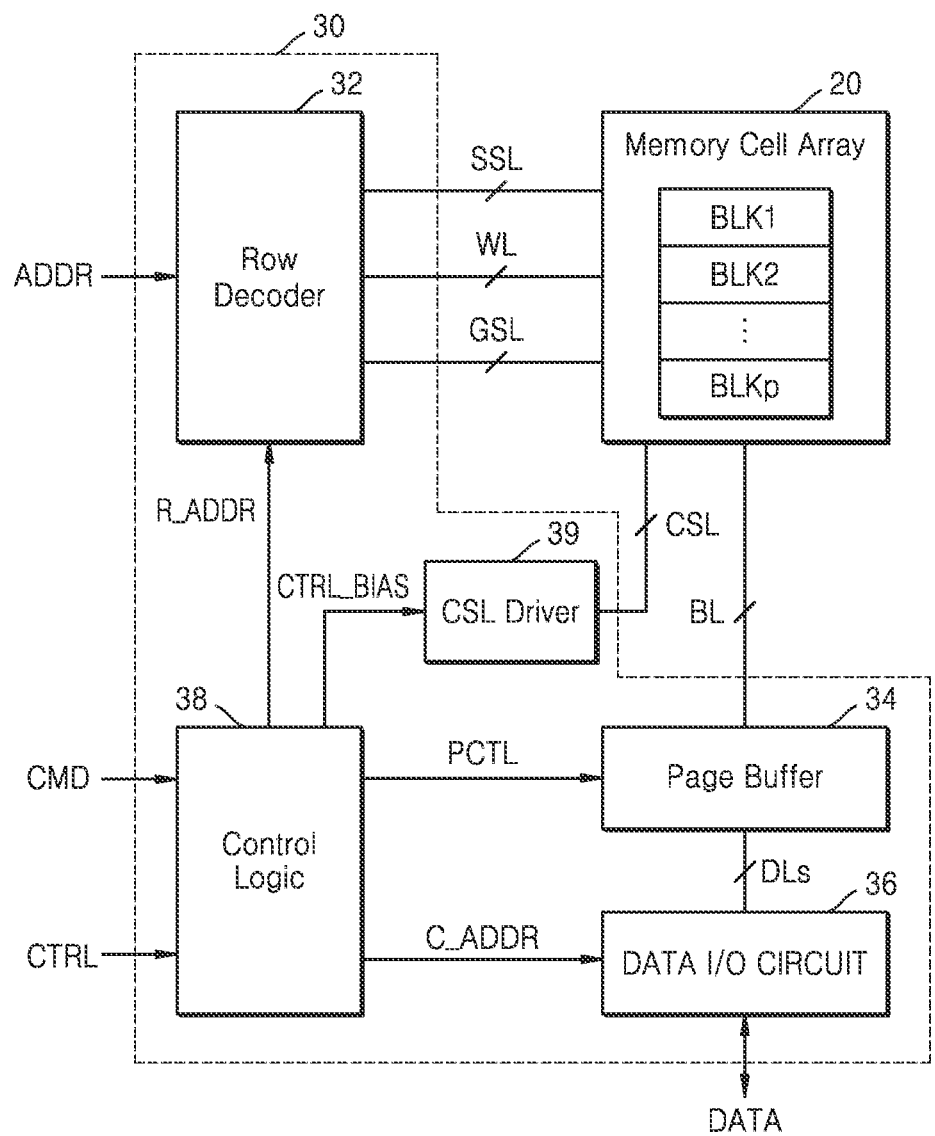
FIG. 1 is a block diagram of a semiconductor device according to some embodiments of the inventive concept.

FIG. 1 is a block diagram of a semiconductor device 10 according to some embodiments of the inventive concept.

Referring to FIG. 1, the semiconductor device 10 may include a memory cell array 20 and a peripheral circuit 30. The memory cell array 20 may include a plurality of memory cell blocks BLK1, BLK2, . . . , and BLKp. Each of the plurality of memory cell blocks BLK1, BLK2, . . . , and BLKp may include a plurality of memory cells. The plurality of memory cell blocks BLK1, BLK2, . . . , and BLKp may be connected to the peripheral circuit 30 through a bit line BL, a word line WL, a string selection line SSL, and a ground selection line GSL.

The peripheral circuit 30 may include a row decoder 32, a page buffer 34, a data input/output (I/O) circuit 36, a control logic 38, and a common source line driver 39. The peripheral circuit 30 may further include various circuits such as a voltage generating circuit for generating various voltages needed for an operation of the semiconductor device 10, an error correction circuit for correcting an error of data read from the memory cell array 20, and an I/O interface.

The memory cell array 20 may be connected to the row decoder 32 through the word line WL, the string selection line SSL, and the ground selection line GSL and may be connected to the page buffer 34 through the bit line BL. In the memory cell array 20, each of the plurality of memory cells included in each of the plurality of memory cell blocks BLK1, BLK2, . . . , and BLKp may be a flash memory cell. The memory cell array 20 may include a three-dimensional (3D) memory cell array. The 3D memory cell array may include a plurality of NAND strings, and each of the plurality of NAND strings may include a plurality of memory cells connected to a plurality of word lines WL, which are vertically stacked.

The peripheral circuit 30 may receive an address ADDR, a command CMD, and a control signal CTRL from the outside of the semiconductor device 10 and may transmit and receive data DATA to and from a device outside the semiconductor device 10.

The row decoder 32 may select at least one memory cell block among the plurality of memory cell blocks BLK1, BLK2, . . . , and BLKp in response to the address ADDR from the outside and may select a word line WL, a string selection line SSL, and a ground selection line GSL of the selected memory cell block. The row decoder 32 may transfer a voltage, which is for performing a memory operation, to the word line WL of the selected memory cell block.

The page buffer 34 may be connected to the memory cell array 20 through the bit line BL. In performing a program operation, the page buffer 34 may operate as a write driver to apply a voltage, based on data DATA which is to be stored in the memory cell array 20, to the bit line BL, and in performing a read operation, the page buffer 34 may operate as a sensing amplifier to sense the data DATA stored in the memory cell array 20. The page buffer 34 may operate based on a control signal PCTL provided from the control logic 38.

The data I/O circuit 36 may be connected to the page buffer 34 through a plurality of data lines DL. In performing a program operation, the data I/O circuit 36 may receive the data DATA from a memory controller (not shown) and may provide program data DATA to the page buffer 34 on the basis of a column address C_ADDR provided from the control logic 38. In performing a read operation, the data I/O circuit 36 may provide the memory controller with read data DATA stored in the page buffer 34 on the basis of the column address C_ADDR.

The data I/O circuit 36 may transfer an address or a command, which is input thereto, to the control logic 38 or the row decoder 32. The peripheral circuit 30 may further include an electrostatic discharge (ESD) circuit and/or a pull-up/pull-down driver. As used herein the term "and/or" includes any and all combinations of one or more of the associated listed items.

The control logic 38 may receive the command CMD and the control signal CTRL from the memory controller. The control logic 38 may provide a row address R_ADDR to the row decoder 32 and may provide the column address C_ADDR to the data I/O circuit 36. The control logic 38 may generate various internal control signals which are used in the semiconductor device 10, in response to the control signal CTRL. For example, the control logic 38 may control a voltage level to the word line WL and the bit line BL in performing a memory operation such as a program operation or an erase operation.

The common source line driver 39 may be connected to the memory cell array 20 through the common source line CSL. The common source line driver 39 may apply a common source voltage (for example, a source voltage) or a ground voltage to the common source line CSL on the basis of control signal CTRL BIAS by the control logic 38.

Figure 2:
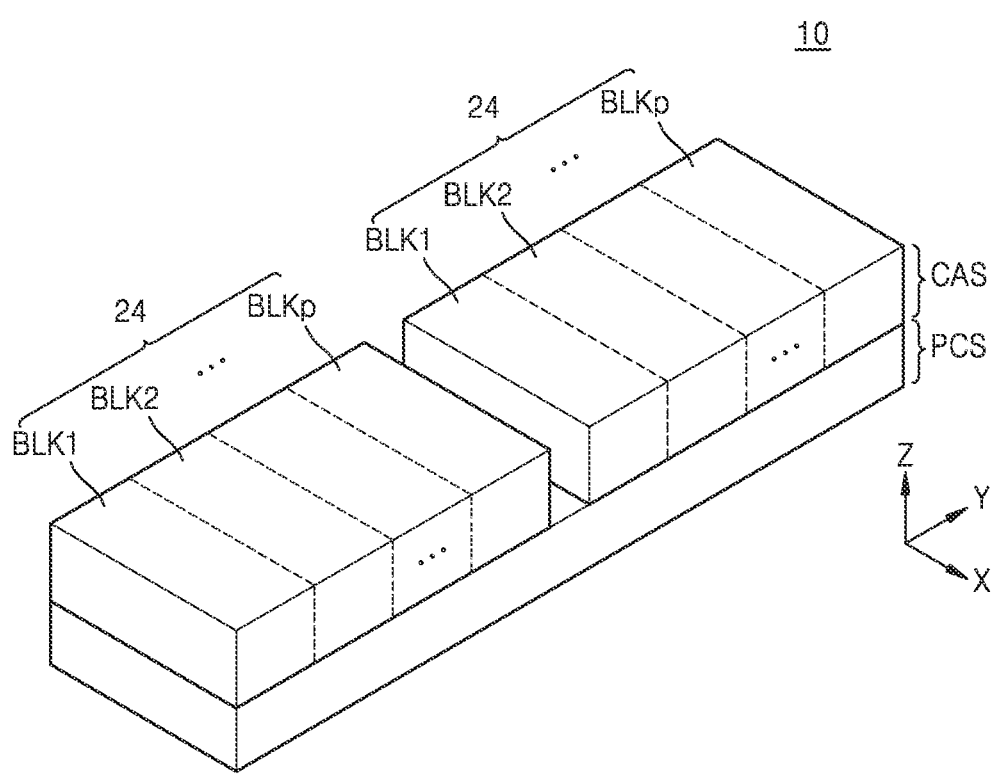
FIG. 2 is a schematic perspective view of a semiconductor device according to embodiments of the inventive concept.

FIG. 2 is a schematic perspective view of a semiconductor device 10 according to some embodiments of the inventive concept.

Referring to FIG. 2, the semiconductor device 10 may include a cell array structure CAS and a peripheral circuit structure PCS, which overlap in a vertical direction (a Z direction). The cell array structure CAS may include the memory cell array 20 described above with reference to FIG. 1. The peripheral circuit structure PCS may include the peripheral circuit 30 described above with reference to FIG. 1. As used herein, references to an element A overlapping an element B in a vertical direction (or similar language) mean that at least one vertical line can be drawn that intersects both elements A and B.

The cell array structure CAS may include a plurality of tiles 24. Each of the plurality of tiles 24 may include a plurality of memory cell blocks BLK1, BLK2, . . . , and BLKp. Each of the plurality of memory cell blocks BLK1, BLK2, . . . , and BLKp may include a plurality of memory cells, which are three-dimensionally arranged.

In example embodiments, two tiles 24 may be included in one mat, but the inventive concept is not limited thereto. The memory cell array 20 described above with reference to FIG. 1 may include a plurality of mats (for example, four mats), but the inventive concept is not limited thereto.

Figure 3:
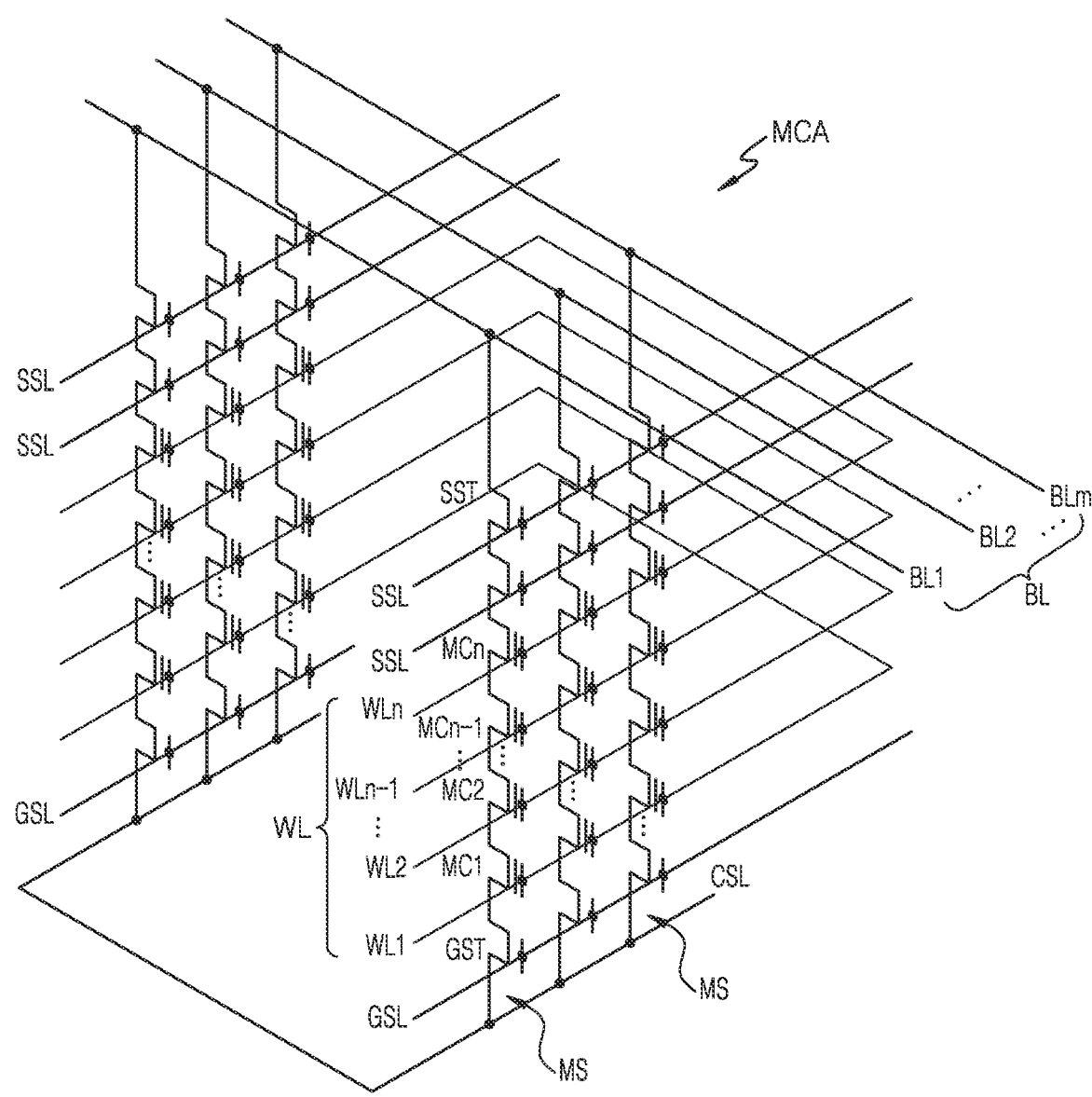
FIG. 3 is an equivalent circuit diagram of a memory cell array of a semiconductor device according to some embodiments of the inventive concept.

FIG. 3 is an equivalent circuit diagram of a memory cell array MCA of a semiconductor device according to some embodiments of the inventive concept. In FIG. 3, an equivalent circuit diagram of a vertical NAND flash memory having a vertical channel structure is illustrated. Each of the plurality of memory cell blocks BLK1, BLK2, . . . , and BLKp illustrated in FIGS. 1 and 2 may include a memory cell array MCA having a circuit configuration illustrated in FIG. 3.

Referring to FIG. 3, the memory cell array MCA may include a plurality of memory cell strings MS. The memory cell array MCA may include a plurality of bit lines BL (BL1, BL2, . . . , and BLm), a plurality of word lines WL (WL1, WL2, . . . , WLn-1, and WLn), at least one string selection line SSL, at least one ground selection line GSL, and a common source line CSL. The plurality of memory cell strings MS may be formed between the plurality of bit lines BL and the common source line CSL. In FIG. 3, an example is illustrated where each of the plurality of memory cell strings MS includes one ground selection line GSL and two string selection lines SSL, but the inventive concept is not limited thereto. For example, each of the plurality of memory cell strings MS may include one string selection line SSL.

Each of the plurality of memory cell strings MS may include a string selection transistor SST, a ground selection transistor GST, and a plurality of memory cell transistors MC1, MC2, . . . , MCn-1, and MCn. A drain region of the string selection transistor SST may be connected to a bit line BL, and a source region of the ground selection transistor GST may be connected to the common source line CSL. The common source line CSL may be a region which is connected to source regions of the plurality of ground selection transistors GST in common.

The string selection transistor SST may be connected to the string selection line SSL, and the ground selection transistor GST may be connected to the ground selection line GSL. Each of the plurality of memory cell transistors MC1, MC2, . . . , MCn-1, and MCn may be connected to a word line WL.

FIG. 4 is a schematic plan view of a partial region of a semiconductor device 100 according to some embodiments of the inventive concept.

Referring to FIG. 4, a cell array structure CAS of the semiconductor device 100 may include an upper substrate 110 and a plurality of memory cell blocks BLK1, BLK2, . . . , and BLKp disposed on the upper substrate 110.

The peripheral circuit structure PCS (see FIG. 2) may be disposed under the upper substrate 110. The plurality of memory cell blocks BLK1, BLK2, . . . , and BLKp may overlap the peripheral circuit structure PCS in a vertical direction (a Z direction) with the upper substrate 110 therebetween. The peripheral circuit structure PCS disposed under the upper substrate 110 may include the peripheral circuit 30 described above with reference to FIG. 1.

The cell array structure CAS may include a memory cell region MEC and a connection region CON which is disposed adjacent (e.g., at) each of opposing sides of the memory cell region MEC in a first horizontal direction (an X direction). Each of the plurality of memory cell blocks BLK1, BLK2, . . . , and BLKp may include a memory stack structure MST which extends in the first horizontal direction (the X direction) over the memory cell region MEC and the connection region CON. The memory stack structure MST may include a plurality of gate lines 130, which are stacked to overlap in a vertical direction (a Z direction) in the memory cell region MEC and the connection region CON of the upper substrate 110. In each of the plurality of memory stack structures MST, the plurality of gate lines 130 may be included in a gate stack GS. In each of the plurality of memory stack structures MST, the plurality of gate lines 130 may include the ground selection line GSL, the plurality of word lines WL, and the string selection line SSL each illustrated in FIG. 3. In an X-Y plane, the plurality of gate lines 130 may be progressively reduced in area as a distance from the upper substrate 110 increases. In some embodiments, surface areas of the plurality of gate lines 130 in the X-Y plane decrease as a distance from the upper substrate 110 increases as illustrated in FIG. 4. A center portion of each of the plurality of gate lines 130 overlapping in the vertical direction (the Z direction) may be included in the memory cell region MEC, and an edge portion of each of the plurality of gate lines 130 may be included in the connection region CON. As used herein, "an element A extends in a direction X" (or similar language) may mean that the element A extends longitudinally in the direction X.

A plurality of word line cut structures WLC, extending longitudinally in a first horizontal direction (an X direction) in the memory cell region MEC and the connection region CON, may be disposed on the upper substrate 110. The plurality of word line cut structures WLC may be spaced apart from one another in a second horizontal direction (a Y direction). The plurality of memory cell blocks BLK1, BLK2, . . . , and BLKp may each be disposed between two adjacent word line cut structures WLC of the plurality of word line cut structures WLC.

Figure 5A:
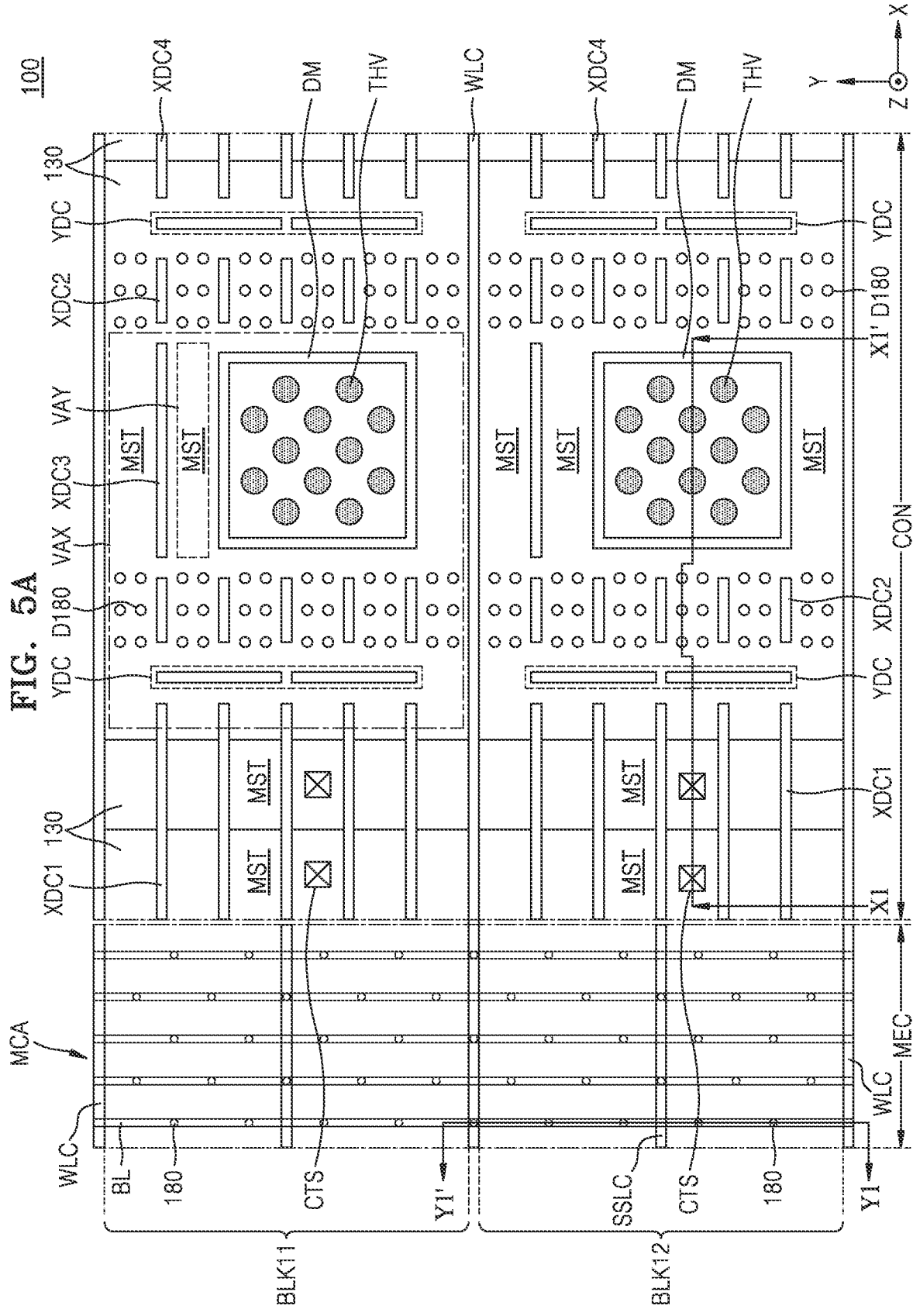
FIG. 5A is a plan view illustrating some elements of a memory cell block of a semiconductor device according to some embodiments of the inventive concept.
Figure 5B:
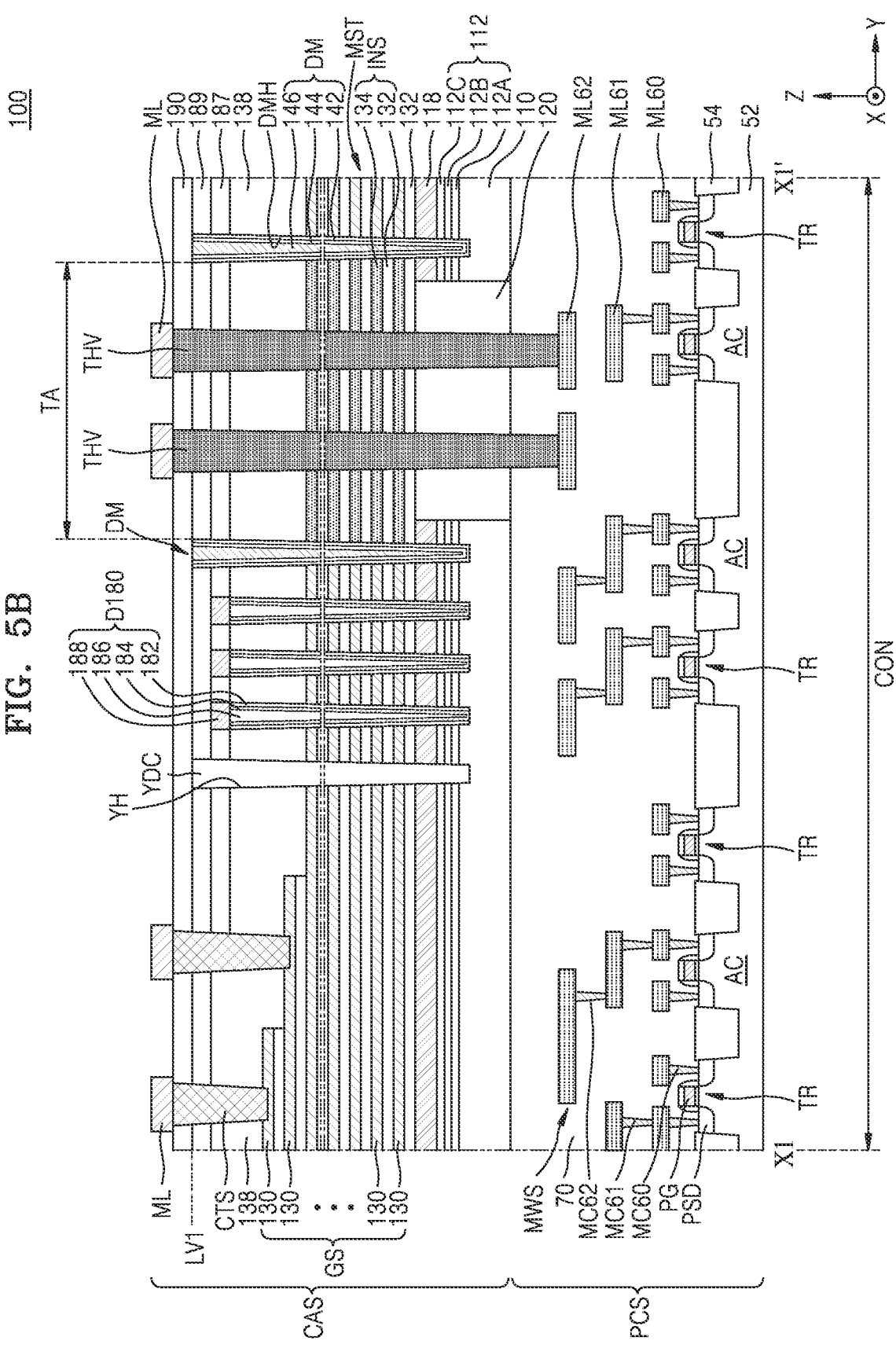
FIG. 5B is a cross-sectional view taken along line X1-X1' of FIG. 5A.
Figure 5C:
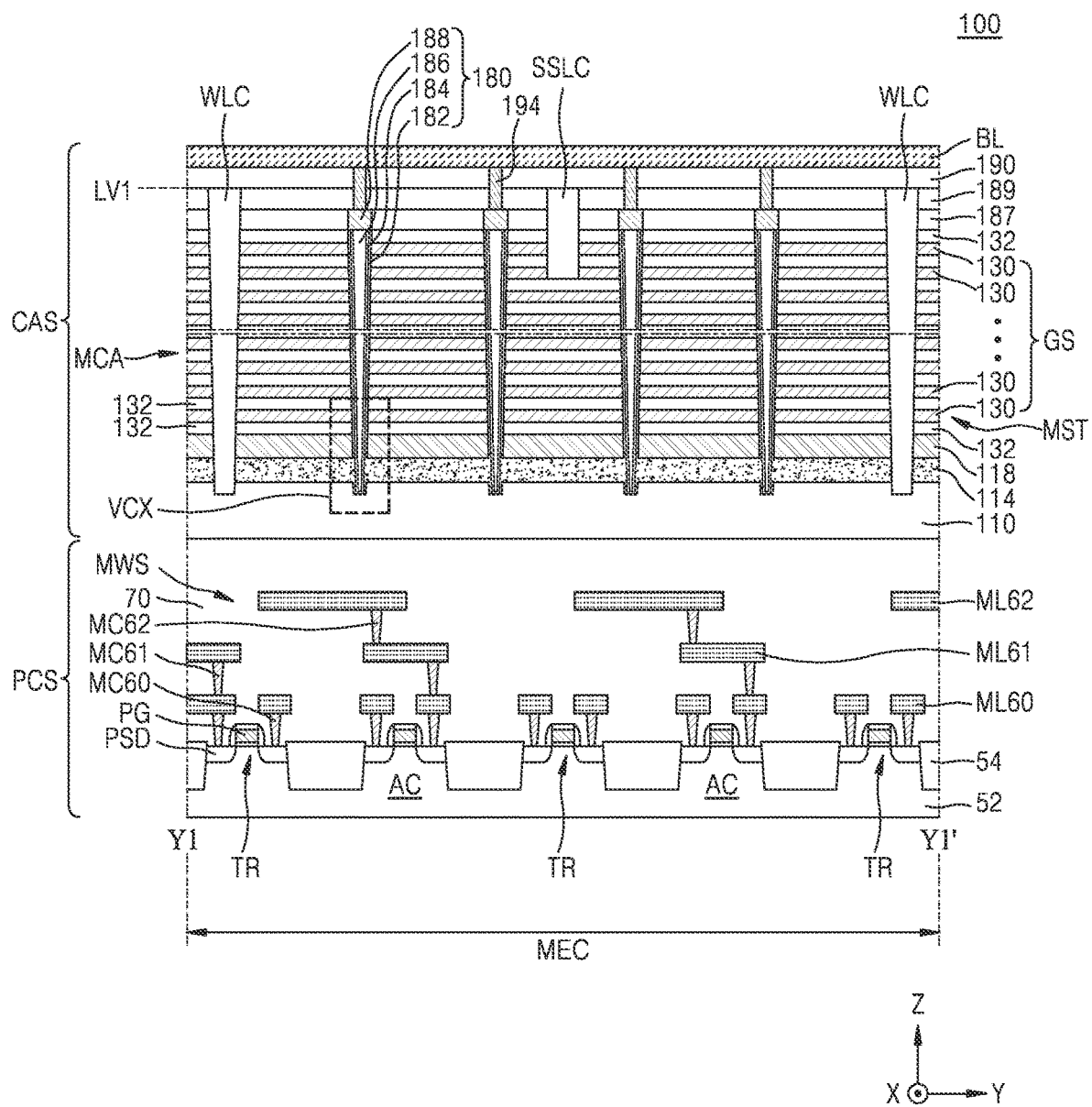
FIG. 5C is a cross-sectional view taken along line Y1-Y1' of FIG. 5A.
Figure 5D:
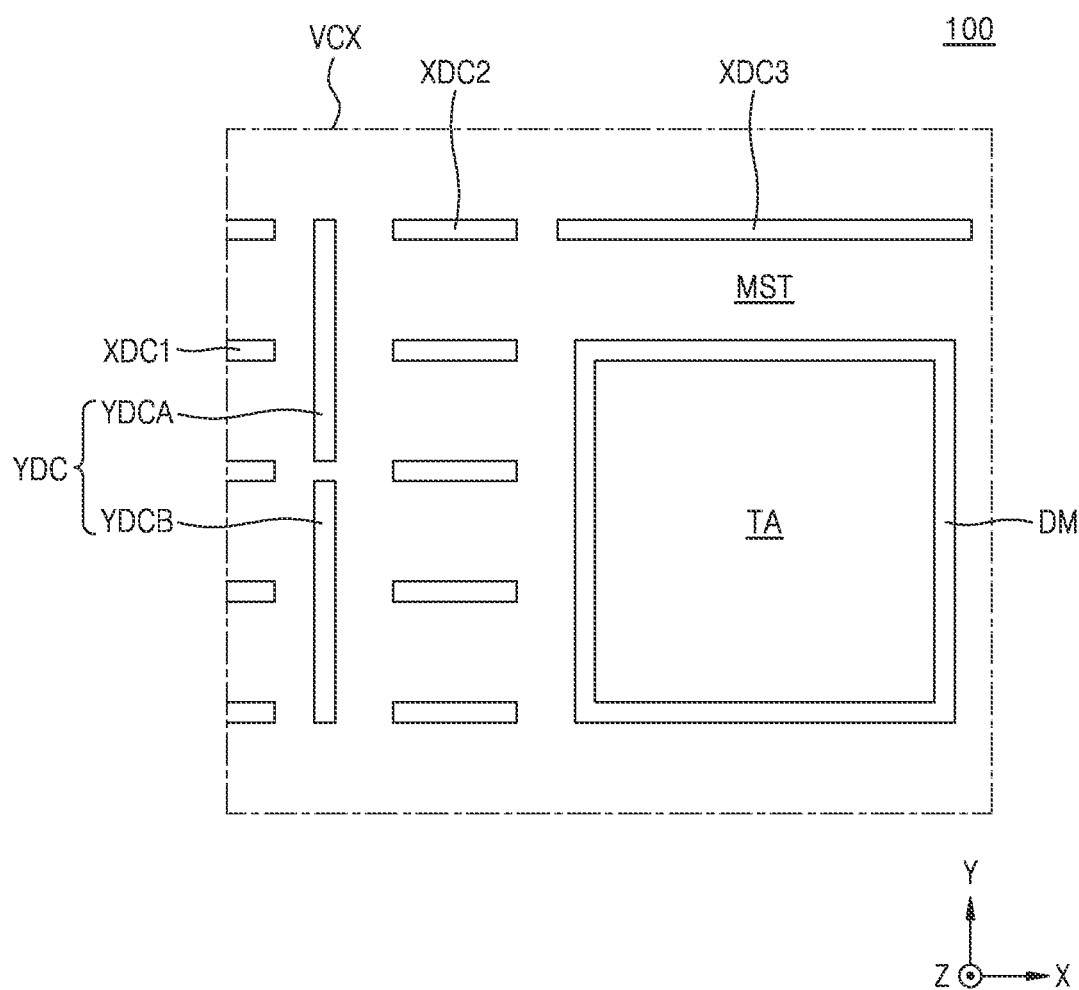
FIG. 5D is a plan view illustrating some elements included in a region VAX in FIG. 5A.
Figure 5E:
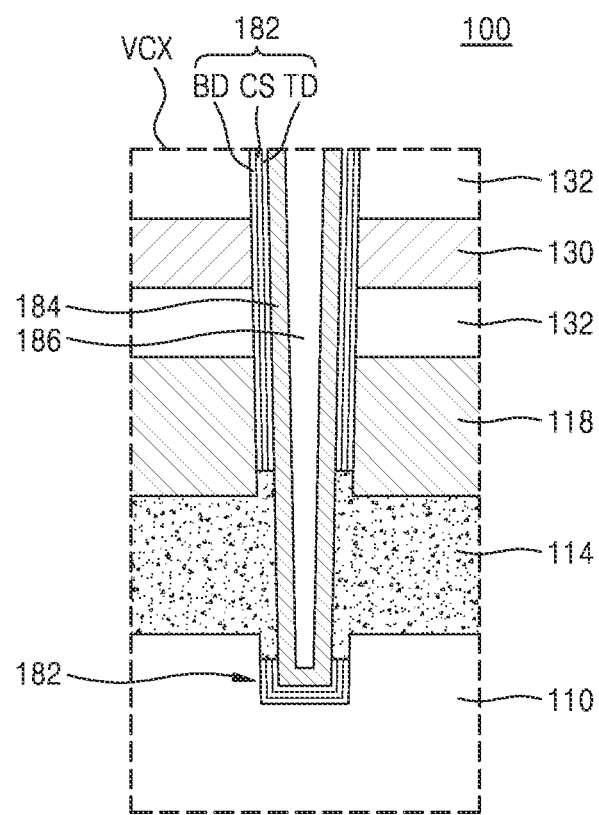
FIG. 5E is a cross-sectional view illustrating some elements included in a region VCX in FIG. 5C.

FIGS. 5A to 5E are diagrams for describing in more detail a semiconductor device 100 according to some embodiments of the inventive concept. FIG. 5A is a plan view illustrating some elements of memory cell blocks BLK11 and BLK12 of the plurality of memory cell blocks BLK1, BLK2, . . . , and BLKp illustrated in FIG. 4. FIG. 5B is a cross-sectional view taken along the line X1-X1' of FIG. 5A. FIG. 5C is a cross-sectional view taken along the line Y1-Y1' of FIG. 5A. FIG. 5D is a plan view illustrating some elements included in a region VAX in FIG. 5A. FIG. 5E is a cross-sectional view illustrating some elements included in a region VCX in FIG. 5C.

Referring to FIGS. 5A to 5E, a semiconductor device 100 may include a peripheral circuit structure PCS and a cell array structure CAS, which is disposed on the peripheral circuit structure PCS and overlaps the peripheral circuit structure PCS in a vertical direction (a Z direction).

The cell array structure CAS may include an upper substrate 110, a first conductive plate 114, a second conductive plate 118, an insulation plate 112, and a memory stack structure MST. In the cell array structure CAS, the first conductive plate 114, the second conductive plate 118, and the memory stack structure MST may be sequentially stacked on the upper substrate 110 in the memory cell region MEC. In the cell array structure CAS, the insulation plate 112, the second conductive plate 118, and the memory stack structure MST may be sequentially stacked on the upper substrate 110 in the connection region CON.

The first conductive plate 114 and the second conductive plate 118 may perform a function of the common source line CSL described above with reference to FIG. 3. The first conductive plate 114 and the second conductive plate 118 may function as a source region which provides a current to a plurality of vertical memory cells included in the cell array structure CAS.

In example embodiments, the upper substrate 110 may include a semiconductor material such as polysilicon. Each of the first conductive plate 114 and the second conductive plate 118 may include doped polysilicon, a metal layer, or a combination thereof. The metal layer may include, for example, tungsten (W), but the inventive concept is not limited thereto. The memory stack structure MST may include a gate stack GS. The gate stack GS may include a plurality of gate lines 130 which extend in parallel in a horizontal direction and overlap in a vertical direction (a Z direction). Each of the plurality of gate lines 130 may include metal, metal silicide, an impurity-doped semiconductor, or a combination thereof. For example, each of the plurality of gate lines 130 may include metal such as tungsten, nickel, cobalt, or tantalum, metal silicide such as tungsten silicide, nickel silicide, cobalt silicide, or tantalum silicide, doped polysilicon, or a combination thereof.

An insulation layer 132 may be disposed between the second conductive plate 118 and the plurality of gate lines 130 and between two adjacent gate lines 130 of the plurality of gate lines 130. An uppermost gate line 130 of the plurality of gate lines 130 may be covered by the insulation layer 132. The insulation layer 132 may include silicon oxide.

In the memory cell region MEC and the connection region CON, the plurality of word line cut structures WLC may extend longitudinally in a first horizontal direction (an X direction) on the upper substrate 110. A width of each of the plurality of gate lines 130 included in the memory cell blocks BLK11 and BLK12 in a second horizontal direction (a Y direction) may be defined by the plurality of word line cut structures WLC.

The plurality of word line cut structures WLC may each include an insulation structure. In example embodiments, the insulation structure may include, for example, silicon oxide, silicon nitride, silicon oxynitride, or a low-k dielectric material. For example, the insulation structure may include a silicon oxide layer, a silicon nitride layer, a SiON layer, a SiOCN layer, a SiCN layer, or a combination thereof. In some example embodiments, at least a portion of the insulation structure may include an air gap. Herein, the term "air" may refer to gases in air or in a manufacturing process (e.g., an inert gas). It will be understood that "air gap" may be, for example, any void or cavity or a gap defining a vacuum.

A plurality of gate lines 130 included in one gate stack GS may be stacked on a second conductive plate 118 to overlap one another in a vertical direction (a Z direction), between two adjacent word line cut structures WLC. The plurality of gate lines 130 of one gate stack GS may include the ground selection line GSL, the plurality of word lines WL, and the string selection line SSL, each of which was described above with reference to FIG. 3.

As illustrated in FIG. 5C, two upper gate lines 130 of the plurality of gate lines 130 may be spaced apart from each other in a second horizontal direction (a Y direction) with a string selection line cut structure SSLC therebetween. The two upper gate lines 130, which are spaced apart from each other with the string selection line cut structure SSLC therebetween, may be the string selection line SSL described above with reference to FIG. 3. In FIG. 5C, an example where one string selection line cut structure SSLC is formed in one gate stack GS is illustrated, but the inventive concept is not limited to the illustration of FIG. 5C. For example, at least two string selection line cut structures SSLC may be formed in one gate stack GS. The string selection line cut structure SSLC may be filled with an insulation layer. In example embodiments, the string selection line cut structure SSLC may include an insulation layer which includes, for example, oxide, nitride, or a combination thereof. In example embodiments, at least a portion of the string selection line cut structure SSLC may include an air gap.

As illustrated in FIGS. 5A and 5C, the plurality of channel structures 180 may pass through a plurality of gate lines 130, a plurality of insulation layers 132, a second conductive plate 118, and a first conductive plate 114, may extend in a vertical direction (a Z direction), may be on an upper substrate 110 in the memory cell region MEC. The plurality of channel structures 180 may be spaced apart from one another by a certain interval in the first horizontal direction (the X direction) and the second horizontal direction (the Y direction). The plurality of channel structures 180 may each include a gate dielectric layer 182, a channel region 184, a buried insulation layer 186, and a drain region 188.

As illustrated in FIG. 5E, the gate dielectric layer 182 may include a tunneling dielectric layer TD, a charge storage layer CS, and a blocking dielectric layer BD, which are sequentially formed on the channel region 184. A relative thickness of each of the tunneling dielectric layer TD, the charge storage layer CS, and the blocking dielectric layer BD is not limited to the illustration of FIG. 5E and may be variously modified.

The tunneling dielectric layer TD may include, for example, silicon oxide, hafnium oxide, aluminum oxide, zirconium oxide, and/or tantalum oxide. The charge storage layer CS may be a region which stores electrons passing through the tunneling dielectric layer TD from the channel region 184 and may include, for example, silicon nitride, boron nitride, silicon boron nitride, and/or impurity-doped polysilicon. The blocking dielectric layer BD may include metal oxide having a dielectric constant greater than a dielectric constant of silicon oxide, silicon nitride, or silicon oxynitride. The metal oxide may include, for example, hafnium oxide, aluminum oxide, zirconium oxide, tantalum oxide, or a combination thereof.

As illustrated in FIG. 5E, the first conductive plate 114 may pass through a partial region of the gate dielectric layer 182 in a horizontal direction (the X direction and/or the Y direction) and may contact the channel region 184. A thickness, in the Z direction, of a portion of the first conductive plate 114, which vertically overlaps the gate dielectric layer 182, may be greater than a thickness, in the Z direction, of a portion of the first conductive plate 114, which vertically overlaps the second conductive plate 118. The gate dielectric layer 182 may include a portion, covering a sidewall of the channel region 184 at a level which is higher than the first conductive plate 114, and a portion covering a bottom surface of the channel region 184 at a level which is lower than the first conductive plate 114. The channel region 184 may be spaced apart from the upper substrate 110 with a lowermost portion of the gate dielectric layer 182. A sidewall of the channel region 184 may contact the first conductive plate 114 and may be electrically connected to the first conductive plate 114.

As illustrated in FIGS. 5C and 5E, the channel region 184 may have a cylinder shape. The channel region 184 may include, for example, doped polysilicon and/or undoped polysilicon.

The buried insulation layer 186 may fill an inner space of the channel region 184. The buried insulation layer 186 may include an insulating material. For example, the buried insulation layer 186 may include silicon oxide, silicon nitride, silicon oxynitride, or a combination thereof. In some embodiments, the buried insulation layer 186 may be omitted. In this case, the channel region 184 may have a pillar structure which is not hollow.

The drain region 188 may include, for example, doped polysilicon. A plurality of drain regions 188 may be insulated from one another by a first upper insulation layer 187. In the memory cell region MEC, a plurality of channel structures 180 and a first upper insulation layer 187 may be covered by a second upper insulation layer 189.

The string selection line cut structure SSLC may pass through the first upper insulation layer 187 and the second upper insulation layer 189 in the vertical direction (the Z direction). A top surface of the string selection line cut structure SSLC, a top surface of the word line cut structure WLC, and a top surface of the second upper insulation layer 189 may be at a first level LV1 from the upper substrate 110. The string selection line cut structure SSLC, the word line cut structure WLC, and the second upper insulation layer 189 may be covered by a third upper insulation layer 190. The first upper insulation layer 187, the second upper insulation layer 189, and the third upper insulation layer 190 may each include, for example, oxide, nitride, or a combination thereof.

As illustrated in FIGS. 5A and 5C, in the memory cell region MEC of the memory stack structure MST, a plurality of bit lines BL may be disposed on the third upper insulation layer 190. The plurality of bit lines BL may extend in parallel in the second horizontal direction (the Y direction). Each of the plurality of channel structures 180 may be connected to one of the plurality of bit lines BL through a plurality of contact plugs 194 which pass through the second upper insulation layer 189 and the third upper insulation layer 190.

As illustrated in FIG. 5B, in the connection region CON of the memory stack structure MST, the insulation plate 112 and the second conductive plate 118 may be sequentially stacked on the upper substrate 110. The insulation plate 112 may include an insulation layer having a multilayer structure including a first insulation layer 112A, a second insulation layer 112B, and a third insulation layer 112C which are sequentially stacked on the upper substrate 110. In example embodiments, the first insulation layer 112A and the third insulation layer 112C may include silicon oxide, and the second insulation layer 112B may include silicon nitride.

In the connection region CON, an edge portion of each of a plurality of gate lines 130 and a plurality of insulation layers 132 may be covered by an interlayer insulation layer 138. The interlayer insulation layer 138 may include silicon oxide, but the inventive concept is not limited thereto.

As illustrated in FIGS. 5A and 5B, in the connection region CON, a plurality of dummy channel structures D180 may pass through the interlayer insulation layer 138, the plurality of gate lines 130, the plurality of insulation layers 132, the second conductive plate 118, and the insulation plate 112 and may extend in the vertical direction (the Z direction). The plurality of dummy channel structures D180 may be spaced apart from one another by a certain interval in the first horizontal direction (the X direction) and the second horizontal direction (the Y direction). Similar to the channel structure 180, the plurality of dummy channel structures D180 may include a gate dielectric layer 182, a channel region 184, a buried insulation layer 186, and a drain region 188. In a plan view, a size of each of the plurality of dummy channel structures D180 may be greater than that of the channel structure 180. The drain region 188 of each of the plurality of dummy channel structures D180 may not be electrically connected to any conductive element of the semiconductor device 100 (e.g., the plurality of bit lines BL), and the channel region 184 of each of the plurality of dummy channel structures D180 may not be used as a channel. In some embodiments, the second upper insulation layer 189 may contact an entire upper surface of the drain region 188 of each of the plurality of dummy channel structures D180.

As illustrated in FIG. 5B, in the connection region CON, the interlayer insulation layer 138 may be covered by the first upper insulation layer 187. The drain region 188 of each of the plurality of dummy channel structures D180 may be insulated from an adjacent drain region 188 by the first upper insulation layer 187. In the connection region CON, the plurality of dummy channel structures D180 and the first upper insulation layer 187 may be covered by the second upper insulation layer 189.

As illustrated in FIGS. 5A and 5B, each of memory cell blocks BLK11 and BLK12 between two adjacent word line cut structures WLC in the connection region CON may include a dam structure DM and an intersection direction cut structure YDC. Each of the dam structure DM and the intersection direction cut structure YDC may pass through the interlayer insulation layer 138, the plurality of gate lines 130, the plurality of insulation layers 132, the second conductive plate 118, and the insulation plate 112, may extend in the vertical direction (the Z direction), may be on the upper substrate 110.

The dam structure DM may include a first insulation liner 142, a second insulation liner 144, and a main plug 146 which are sequentially stacked toward an inner portion of a dam hole DMH from an inner wall of the dam hole DMH which passes through the interlayer insulation layer 138, the plurality of gate lines 130, the plurality of insulation layers 132, the second conductive plate 118, and the insulation plate 112. In example embodiments, the first insulation liner 142 may include silicon oxide, the second insulation liner 144 may include silicon nitride, and the main plug 146 may include polysilicon. However, the inventive concept is not limited thereto.

In FIG. 5A, a configuration where one dam structure DM is disposed between two adjacent word line cut structures WLC is illustrated, but the inventive concept is not limited thereto. For example, a plurality of dam structures DM may be arranged in one row in the second horizontal direction (the Y direction) and may be spaced apart from one another between two adjacent word line cut structures WLC.

The intersection direction cut structure YDC may include an insulation structure which fills an intersection direction hole YH passing through the interlayer insulation layer 138, the plurality of gate lines 130, the plurality of insulation layers 132, the second conductive plate 118, and the insulation plate 112. A material of the intersection direction cut structure YDC may differ from a material of the dam structure DM. A more detailed configuration of an insulation structure of the intersection direction cut structure YDC may be the same as an insulation structure of a plurality of word line cut structures WLC.

As illustrated in FIG. 5A, the intersection direction cut structure YDC may extend linearly and longitudinally in the second horizontal direction (the Y direction), between two adjacent word line cut structures WLC. The intersection direction cut structure YDC may extend in a direction parallel to the plurality of bit lines BL disposed in the memory cell region MEC. In one memory stack structure MST between two adjacent word line cut structures WLC, the intersection direction cut structure YDC may be disposed adjacent (e.g., at) each of opposing sides of the dam structure DM in the first horizontal direction (the X direction). In some embodiments, the intersection direction cut structure YDC may have a linear shape extending longitudinally in the second horizontal direction (the Y direction) as illustrated in FIG. 5A.

As illustrated in FIGS. 5A and 5D, the intersection direction cut structure YDC may include a plurality of cut lines YDCA and YDCB apart from each other. The plurality of cut lines YDCA and YDCB may be arranged in one row in the second horizontal direction (the Y direction) in one memory stack structure MST and may be apart from one another in the second horizontal direction (the Y direction).

In FIGS. 5A and 5D, an example is illustrated where one intersection direction cut structure YDC includes two cut lines YDCA and YDCB spaced apart from each other in the second horizontal direction (the Y direction), but the inventive concept is not limited thereto. In example embodiments, one intersection direction cut structure YDC may include one cut line which extends longitudinally in the second horizontal direction (the Y direction). In some example embodiments, one intersection direction cut structure YDC may include at least three separate cut lines which extend longitudinally in the second horizontal direction (the Y direction) and are spaced apart from one another in the second horizontal direction (the Y direction).

In FIGS. 5B and 5C, a structure where a material of the dam structure DM differs from a material of the intersection direction cut structure YDC is illustrated, but the inventive concept is not limited thereto. According to some embodiments, a material of the dam structure DM may be the same as that of the intersection direction cut structure YDC.

As illustrated in FIG. 5A, a plurality of dummy word line cut structures XDC1, XDC2, XDC3, and XDC4 may be disposed in each of memory cell blocks BLK11 and BLK12. Similar to the plurality of word line cut structures WLC, each of the plurality of dummy word line cut structures XDC1, XDC2, XDC3, and XDC4 may extend longitudinally in the first horizontal direction (the X direction). Similar to the dam structure DM, in the connection region CON, each of the plurality of dummy word line cut structures XDC1, XDC2, XDC3, and XDC4 may pass through the interlayer insulation layer 138, the plurality of gate lines 130, the plurality of insulation layers 132, the second conductive plate 118, and the insulation plate 112, may extend in the vertical direction (the Z direction), and may be on the upper substrate 110. In some embodiments, a material of each of the plurality of dummy word line cut structures XDC1, XDC2, XDC3, and XDC4 may be the same as that of each of the plurality of word line cut structures WLC described above.

A plurality of dummy word line cut structures XDC1 may be disposed between the memory cell region MEC and the intersection direction cut structure YDC. The plurality of dummy word line cut structures XDC1 may be spaced apart from one another in the second horizontal direction (the Y direction), may be repeatedly arranged in the second horizontal direction (the Y direction), may extend in parallel in the first horizontal direction (the X direction), and may be between the memory cell region MEC and the intersection direction cut structure YDC.

A plurality of dummy word line cut structures XDC2 may be disposed between the intersection direction cut structure YDC and the dam structure DM. The plurality of dummy word line cut structures XDC2 may be spaced apart from one another in the second horizontal direction (the Y direction), may be repeatedly arranged in the second horizontal direction (the Y direction), may extend in parallel in the first horizontal direction (the X direction), and may be between the intersection direction cut structure YDC and the dam structure DM.

A plurality of dummy channel structures D180 may be disposed between the intersection direction cut structure YDC and the dam structure DM. The plurality of dummy channel structures D180 may include two dummy channel structures D180 which are spaced apart from each other with one dummy word line cut structure XDC2. In FIG. 5A, it is illustrated that a plurality of dummy channel structures D180 are disposed in only a partial region of the connection region CON, but the inventive concept is not limited thereto. The plurality of dummy channel structures D180 selected from the memory stack structure MST in the connection region CON may be variously arranged at various positions.

A plurality of dummy word line cut structures XDC3 may be disposed between the word line cut structure WLC and the dam structure DM. The plurality of dummy word line cut structures XDC3 may extend in the first horizontal direction (the X direction) in parallel with a partial region of the dam structure DM. The dummy word line cut structure XDC3 may support portions (for example, a portion VAY in FIG. 5A), may extend longitudinally in the first horizontal direction (the X direction) along a sidewall of the dam structure DM, may be at a position adjacent to the dam structure DM of a stack structure including the memory stack structure MST and the interlayer insulation layer 138 (see FIG. 5B) covering a top surface of the memory stack structure MST in the connection region CON, so that the portions may not fall down or collapse due to stress caused by a relatively large volume of the interlayer insulation layer 138. The intersection direction cut structures YDC may be disposed adjacent (e.g., at) respective opposing sides of the dam structure DM in the first horizontal direction (the X direction) with the dummy word line cut structure XDC3 and the dam structure DM therebetween, and thus, a volume of the interlayer insulation layer 138 in a peripheral region of the dam structure DM may be divided into several small portions. As a result, undesired stress caused by a relatively large volume of the interlayer insulation layer 138 may decrease near the dam structure DM, and undesired deformation, where the stack structure including the memory stack structure MST and the interlayer insulation layer 138 (see FIG. 5B) covering the top surface of the memory stack structure MST collapses or falls down due to stress caused by the relatively large volume of the interlayer insulation layer 138, may be reduced or prevented near the dam structure DM.

A plurality of dummy word line cut structures XDC4 may be spaced apart from a dummy word line cut structure with the dam structure DM, the plurality of intersection direction cut structures YDC, and the plurality of dummy word line cut structures XDC2 and XDC3 therebetween. Similar to the plurality of dummy word line cut structures XDC1, the plurality of dummy word line cut structures XDC4 may be spaced apart from one another in the second horizontal direction (the Y direction), may be repeatedly arranged in the second horizontal direction (the Y direction), and may extend in parallel in the first horizontal direction (the X direction).

Some dummy word line cut structures XDC1, XDC2, XDC3, and XDC4 among the plurality of dummy word line cut structures XDC1, XDC2, XDC3, and XDC4 may be arranged in one row in the first horizontal direction (the X direction) and may be spaced apart from one another in the first horizontal direction (the X direction).

As illustrated in FIG. 5B, a top surface of the dam structure DM and a top surface of each of the plurality of intersection direction cut structures YDC may be at a first level LV1 from the upper substrate 110, in the connection region CON. Although not shown, a top surface of each of the plurality of dummy word line cut structures XDC1, XDC2, XDC3, and XDC4 may be at the first level LV1 of the upper substrate 110.

In the connection region CON, the dam structure DM, the plurality of intersection direction cut structures YDC, the plurality of word line cut structures WLC, the plurality of dummy word line cut structures XDC1, XDC2, XDC3, and XDC4, and the second upper insulation layer 189 may be covered by the third upper insulation layer 190.

As illustrated in FIG. 5B, an insulation plug 120 passing through the upper substrate 110, the insulation plate 112, and the second conductive plate 118 may be disposed in a partial region of the connection region CON. The insulation plug 120 may be disposed in a region which vertically overlaps a through via region TA defined by the dam structure DM. The insulation plug 120 may include silicon oxide, silicon nitride, or a combination thereof.

A portion of the through via region TA defined by the dam structure DM may be filled with an insulation island INS. The insulation island INS may be spaced apart from a plurality of gate lines 130 with the dam structure DM therebetween. The insulation island INS may include, for example, a multiple insulation layer structure where insulation layers 132 and sacrificial insulation layers 134 are alternately stacked. In the insulation island INS, the insulation layer 132 may include, for example, silicon oxide, and the sacrificial insulation layer 134 may include, for example, silicon nitride. In some example embodiments, the insulation island INS may include a single insulation layer. In the through via region TA defined by the dam structure DM, an upper portion of the insulation island INS may be filled with a portion of the interlayer insulation layer 138, a portion of the first upper insulation layer 187, and a portion of the second upper insulation layer 189.

In the through via region TA defined by the dam structure DM, a plurality of through vias THV may pass through the insulation island INS, the interlayer insulation layer 138, the first upper insulation layer 187, the second upper insulation layer 189, and the third upper insulation layer 190 and may extend in the vertical direction (the Z direction). A top surface of each of the plurality of through vias THV may contact a wiring layer ML formed on the third upper insulation layer 190.

Each of the plurality of through vias THV may pass through the insulation plug 120 and may extend longitudinally in the vertical direction (the Z direction) up to the peripheral circuit structure PCS. Each of the plurality of through vias THV may include a portion surrounded by the insulation plug 120 and the insulation island INS. The plurality of through vias THV may be connected to a peripheral circuit included in the peripheral circuit structure PCS. The plurality of through vias THV may include, for example, tungsten, titanium, tantalum, copper, aluminum, titanium nitride, tantalum nitride, tungsten nitride, or a combination thereof.

As illustrated in FIG. 5B, a plurality of contact structures CTS respectively connected to edge portions of the plurality of gate lines 130 may be disposed in the connection region CON. Each of the plurality of contact structures CTS may pass through the interlayer insulation layer 138, the first upper insulation layer 187, the second upper insulation layer 189, and the third upper insulation layer 190 from an edge portion of a corresponding gate line of the plurality of gate lines 130 and may extend longitudinally in the vertical direction (the Z direction). A top surface of each of the plurality of contact structures CTS may contact the wiring layer ML formed on the third upper insulation layer 190. In the connection region CON, a plurality of wiring layers ML formed on the third upper insulation layer 190 may be disposed at the same level from the upper substrate 110 as the plurality of bit lines BL disposed in the memory cell region MEC. The plurality of contact structures CTS and the plurality of wiring layers ML may each include, for example, tungsten, titanium, tantalum, copper, aluminum, titanium nitride, tantalum nitride, tungsten nitride, or a combination thereof.

As illustrated in FIGS. 5B and 5C, the peripheral circuit structure PCS may include a lower substrate 52, a plurality of peripheral circuits formed on the lower substrate 52, and a multilayer wiring structure MWS which connects the plurality of peripheral circuits or connects the plurality of peripheral circuits to elements in the memory cell region MEC.

The lower substrate 52 may include, for example, a semiconductor substrate. For example, the lower substrate 52 may include silicon (Si), germanium (Ge), or SiGe. An active region AC may be defined in the lower substrate 52 by an isolation layer 54. A plurality of transistors TR of the plurality of peripheral circuits may be formed on the active region AC. Each of the plurality of transistors TR may include a gate PG and a plurality of ion implantation regions PSD which are formed in the active region AC adjacent (e.g., at) respective opposing sides of the gate PG. Each of the plurality of ion implantation regions PSD may be a source region or a drain region of a corresponding transistor TR.

The plurality of peripheral circuits included in the peripheral circuit structure PCS may include various circuits included in the peripheral circuit 30 described above with reference to FIG. 1. In example embodiments, the plurality of peripheral circuits included in the peripheral circuit structure PCS may each include the row decoder 32, the page buffer 34, the data I/O circuit 36, the control logic 38, and the common source line driver 39 each illustrated in FIG. 1.

The multilayer wiring structure MWS included in the peripheral circuit structure PCS may include a plurality of peripheral circuit wiring layers ML60, ML61, and ML62 and a plurality of peripheral circuit contacts MC60, MC61, and MC62. At least some of the plurality of peripheral circuit wiring layers ML60, ML61, and ML62 may be electrically connected to a transistor TR. The plurality of peripheral circuit contacts MC60, MC61, and MC62 may connect some transistors TR among the plurality of transistors TR to some peripheral circuit wiring layers among the plurality of peripheral circuit wiring layers ML60, ML61, and ML62.

Each of the plurality of through vias THV disposed in the connection region CON of the cell array structure CAS may be connected to at least one peripheral circuit among the plurality of peripheral circuits, through the multilayer wiring structure MWS included in the peripheral circuit structure PCS. The plurality of through vias THV may be connected to one of the plurality of peripheral circuit wiring layers ML60, ML61, and ML62. For example, each of the plurality of through vias THV may contact an uppermost peripheral circuit wiring layer ML62, which is closest to the cell array structure CAS, of the plurality of peripheral circuit wiring layers ML60, ML61, and ML62. In FIGS. 5B and 5C, the multilayer wiring structure MWS is illustrated as including a three-layer wiring layer in the vertical direction (the Z direction), but the inventive concept is not limited to the illustrations of FIGS. 5B and 5C. For example, the multilayer wiring structure MWS may include a two-layer or four or more-layer wiring layer.

The plurality of peripheral circuit wiring layers ML60, ML61, and ML62 and the plurality of peripheral circuit contacts MC60, MC61, and MC62 may each include, for example, metal, conductive metal nitride, metal silicide, or a combination thereof. For example, the plurality of peripheral circuit wiring layers ML60, ML61, and ML62 and the plurality of peripheral circuit contacts MC60, MC61, and MC62 may each include a conductive material such as tungsten, molybdenum, titanium, cobalt, tantalum, nickel, tungsten silicide, titanium silicide, cobalt silicide, tantalum silicide, or nickel silicide.

The plurality of transistors TR and the multilayer wiring structure MWS, included in the peripheral circuit structure PCS, may be covered by an interlayer insulation layer 70. The plurality of through vias THV may pass through a portion of the interlayer insulation layer 70 and may contact a top surface of the peripheral circuit wiring layer ML62. The interlayer insulation layer 70 may include, for example, silicon oxide, SiON, or SiOCN.

In the semiconductor device 100 described above with reference to FIGS. 4 and 5A to 5E, even in a case where the number of the gate lines 130 stacked in the vertical-direction (Z-direction) increases for enhancing a degree of integration of the semiconductor device 100 and thus a height of the memory stack structure MST increases thereby increasing a volume of the interlayer insulation layer 138 (see FIG. 5B) covering the memory stack structure MST in the connection region CON of the cell array structure CAS, the intersection direction cut structure YDC may be disposed near the dam structure DM in the connection region CON, and thus, a volume of the interlayer insulation layer 138 may be divided into several small portions in a peripheral region of the dam structure DM. As a result, undesired stress caused by a relatively large volume of the interlayer insulation layer 138 may decrease near the dam structure DM. Therefore, undesired deformation, where the stack structure including the memory stack structure MST and the interlayer insulation layer 138 (see FIG. 5B) covering the top surface of the memory stack structure MST collapses or falls down due to stress caused by the relatively large volume of the interlayer insulation layer 138, may be reduced or prevented near the dam structure DM.

Figure 6:
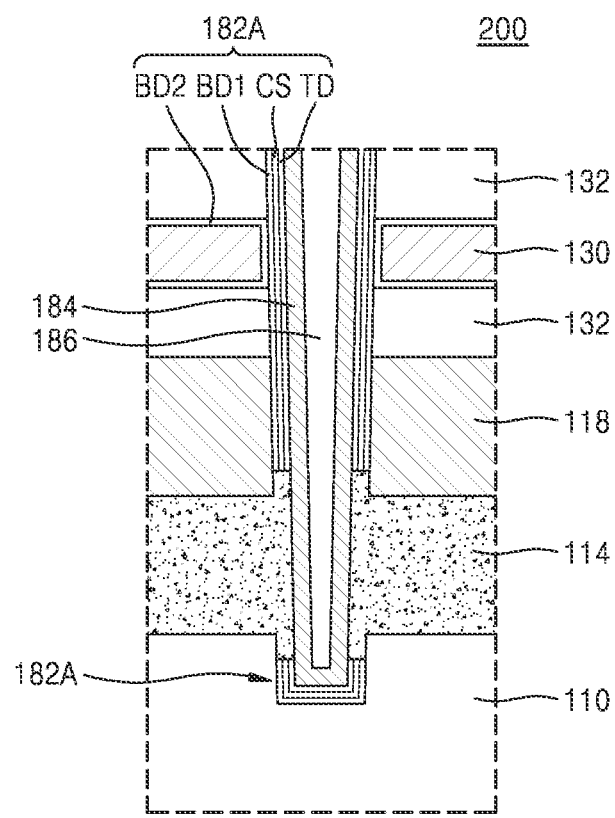
FIG. 6 is a cross-sectional view of a semiconductor device according to some embodiments of the inventive concept.

FIG. 6 is a cross-sectional view of a semiconductor device 200 according to some embodiments of the inventive concept and is an enlarged cross-sectional view of a portion corresponding to a region VCX of FIG. 5C.

Referring to FIG. 6, the semiconductor device 200 may include substantially the same elements as those of the semiconductor device 100 described above with reference to FIGS. 5A to 5E. However, the semiconductor device 200 may include a gate dielectric layer 182A instead of the gate dielectric layer 182. The gate dielectric layer 182A may include substantially the same elements as those of the gate dielectric layer 182 described above with reference to FIGS. 5B and 5C. The gate dielectric layer 182A may include a first blocking dielectric layer BD1 and a second blocking dielectric layer BD2, instead of the blocking dielectric layer BD. The first blocking dielectric layer BD1 may extend in parallel with the channel region 184, and the second blocking dielectric layer BD2 may be disposed to surround the gate line 130. Each of the first blocking dielectric layer BD1 and the second blocking dielectric layer BD2 may include, for example, silicon oxide, silicon nitride, or metal nitride. For example, the first blocking dielectric layer BD1 may include silicon oxide, and the second blocking dielectric layer BD2 may include metal oxide, which is greater in permittivity than silicon oxide. The metal oxide may include, for example, hafnium oxide, aluminum oxide, zirconium oxide, tantalum oxide, or a combination thereof.

Figure 7:
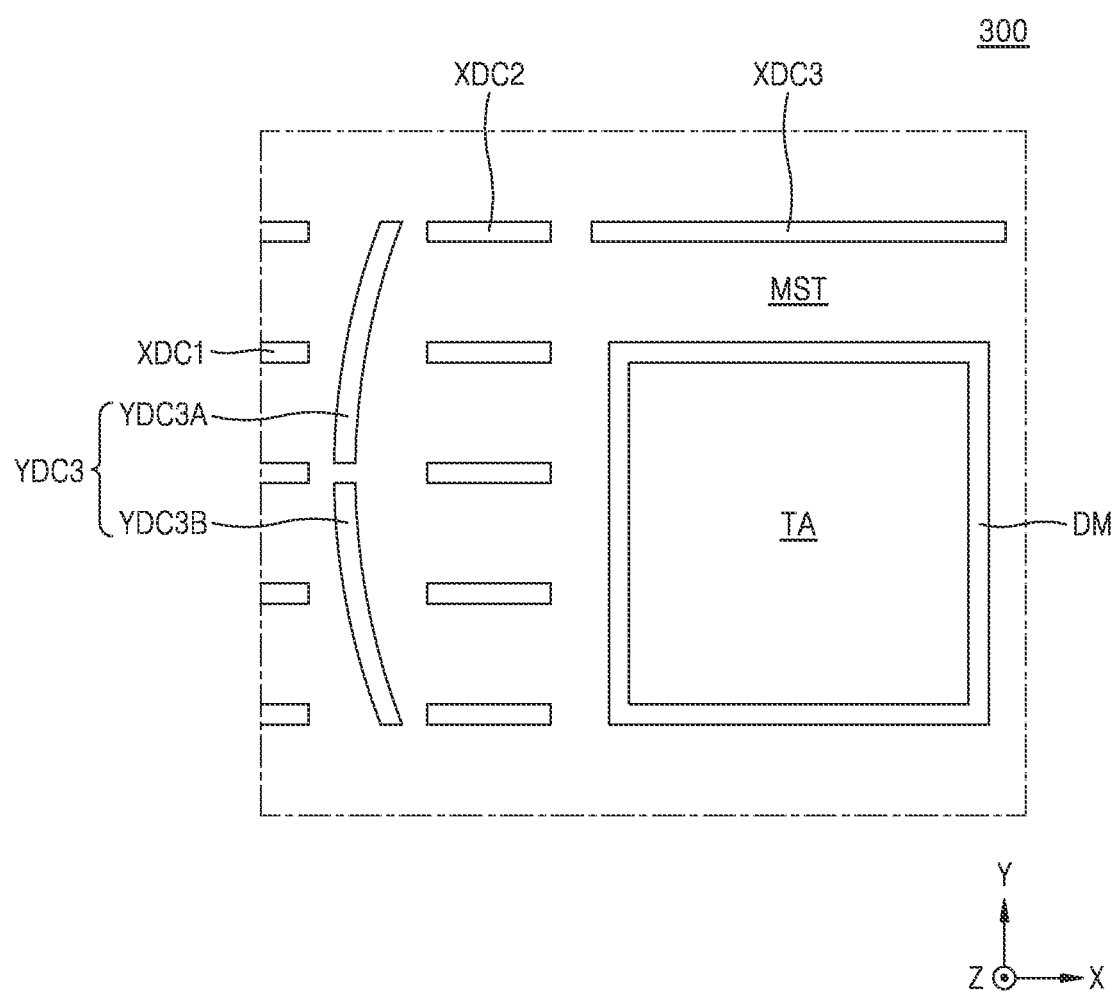
FIG. 7 is a plan view of a semiconductor device according to some embodiments of the inventive concept.

FIG. 7 is a plan view of a semiconductor device 300 according to some embodiments of the inventive concept and is an enlarged cross-sectional view of a portion corresponding to a region VAX of FIG. 5A.

Referring to FIG. 7, the semiconductor device 300 may include substantially the same elements as those of the semiconductor device 100 described above with reference to FIGS. 5A to 5E. However, the semiconductor device 300 may include an intersection direction cut structure YDC3. The intersection direction cut structure YDC3 may include substantially the same elements as those of the intersection direction cut structure YDC described above with reference to FIGS. 5A and 5B. The intersection direction cut structure YDC3 may extend nonlinearly and longitudinally in a second horizontal direction (a Y direction). In example embodiments, the intersection direction cut structure YDC3 may extend nonlinearly in the second horizontal direction (the Y direction) to have a shape which is concave viewed from the dam structure DM.

The intersection direction cut structure YDC3 may include a plurality of cut lines YDC3A and YDC3B, which are spaced apart from each other in the second horizontal direction (the Y direction). The plurality of cut lines YDC3A and YDC3B may be arranged in one row in the second horizontal direction (the Y direction). The plurality of cut lines YDC3A and YDC3B may pass through a memory stack structure MST and an interlayer insulation layer 138 (see FIG. 5B) in a vertical direction (a Z direction).

In FIG. 7, an example is illustrated where one intersection direction cut structure YDC3 includes two cut lines YDC3A and YDC3B spaced apart from each other in the second horizontal direction (the Y direction), but the inventive concept is not limited thereto. In some example embodiments, the one intersection direction cut structure YDC3 may include one cut line which extends nonlinearly and longitudinally in the second horizontal direction (the Y direction). In some example embodiments, the one intersection direction cut structure YDC3 may include at least three cut lines which are spaced apart from one another in the second horizontal direction (the Y direction) and extend nonlinearly and longitudinally in the second horizontal direction (the Y direction).

Figure 8:
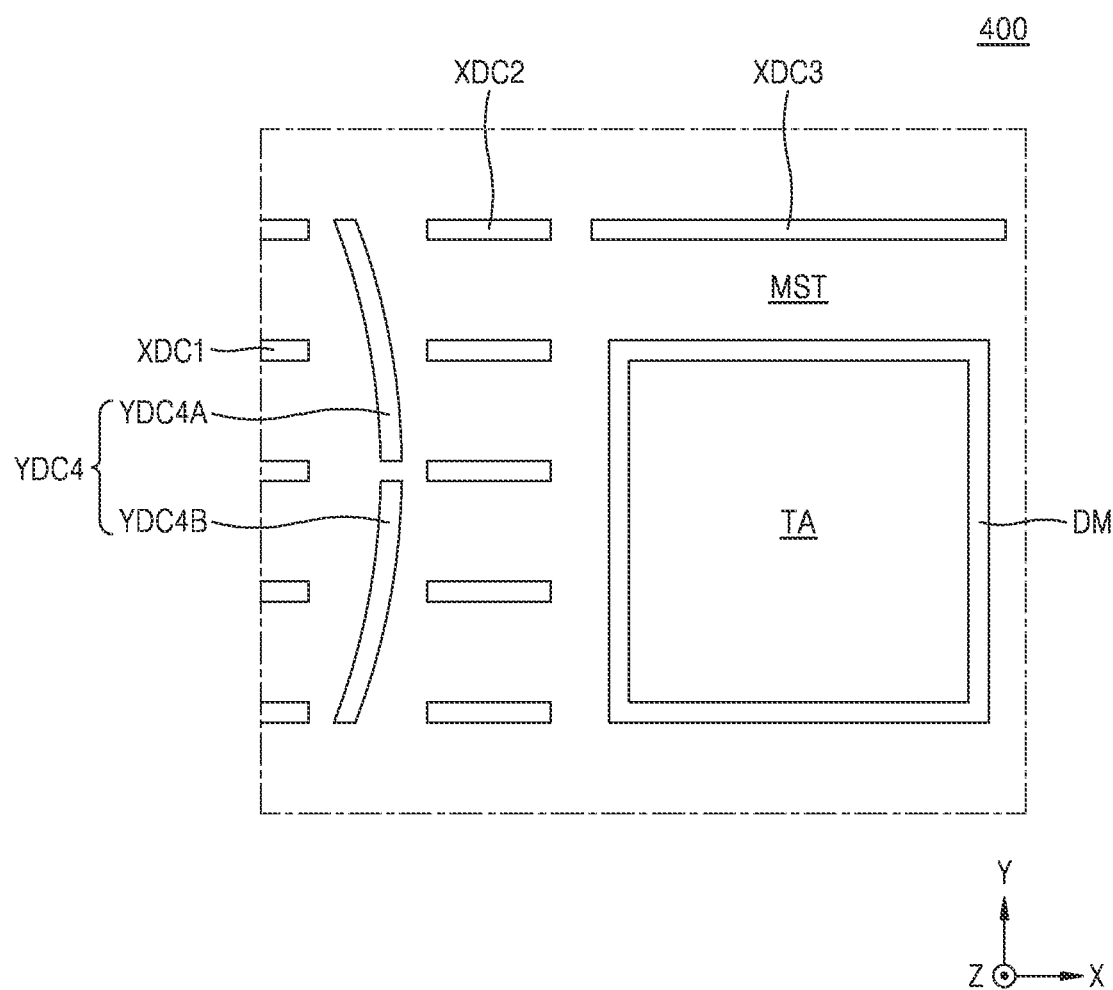
FIG. 8 is a plan view of a semiconductor device according to some embodiments of the inventive concept.

FIG. 8 is a plan view of a semiconductor device 400 according to some embodiments of the inventive concept and is an enlarged plan view of a portion corresponding to a region VAX of FIG. 5A.

Referring to FIG. 8, the semiconductor device 400 may include substantially the same elements as those of the semiconductor device 100 described above with reference to FIGS. 5A to 5E. However, the semiconductor device 400 may include an intersection direction cut structure YDC4. The intersection direction cut structure YDC4 may include substantially the same elements as those of the intersection direction cut structure YDC described above with reference to FIGS. 5A and 5B. The intersection direction cut structure YDC4 may extend nonlinearly and longitudinally in a second horizontal direction (a Y direction). In example embodiments, the intersection direction cut structure YDC4 may extend nonlinearly in the second horizontal direction (the Y direction) to have a shape which is convex viewed from the dam structure DM.

The intersection direction cut structure YDC4 may include a plurality of cut lines YDC4A and YDC4B, which are spaced apart from each other in the second horizontal direction (the Y direction). The plurality of cut lines YDC4A and YDC4B may be arranged in one row in the second horizontal direction (the Y direction). The plurality of cut lines YDC4A and YDC4B may pass through a memory stack structure MST and an interlayer insulation layer 138 (see FIG. 5B) in a vertical direction (a Z direction).

In FIG. 8, an example is illustrated where one intersection direction cut structure YDC4 includes two cut lines YDC4A and YDC4B spaced apart from each other in the second horizontal direction (the Y direction), but the inventive concept is not limited thereto. In some example embodiments, the one intersection direction cut structure YDC4 may include one cut line which extends nonlinearly and longitudinally in the second horizontal direction (the Y direction). In some example embodiments, the one intersection direction cut structure YDC4 may include at least three cut lines which are spaced apart from one another in the second horizontal direction (the Y direction) and extend nonlinearly and longitudinally in the second horizontal direction (the Y direction).

Each of the semiconductor devices 100, 300, and 400, illustrated in FIGS. 5A to 5E, 7, and 8 may include a plurality of intersection direction cut structures YDC, YDC3, and YDC4, which extend linearly or nonlinearly and longitudinally in the second horizontal direction (the Y direction). The plurality of intersection direction cut structures YDC, YDC3, and YDC4 may be disposed near the dam structure DM, and thus, a volume of the interlayer insulation layer 138 in a peripheral region of the dam structure DM may be divided into several small portions. Also, the intersection direction cut structure YDC linearly extending in the second horizontal direction (the Y direction), the intersection direction cut structure YDC3 having a shape which is concave viewed from the dam structure DM, or the intersection direction cut structure YDC4 having a shape which is convex viewed from the dam structure DM may be implemented based on the kind and magnitude of stress caused by the interlayer insulation layer 138, and thus, problems occurring due to stress caused by the interlayer insulation layer 138 near the dam structure DM may be reduced or prevented by using various methods. Therefore, in a semiconductor device which is to be manufactured, the intersection direction cut structures YDC, YDC3, and YDC4 having an appropriate shape may be applied despite various kinds and magnitudes of stress caused by a relatively large volume of the interlayer insulation layer 138. Therefore, undesired deformation, where the stack structure including the memory stack structure MST near the dam structure DM and the interlayer insulation layer 138 (see FIG. 5B) covering the memory stack structure MST collapses or falls down due to stress caused by the relatively large volume of the interlayer insulation layer 138, may be effectively reduced or prevented.

Figure 9:
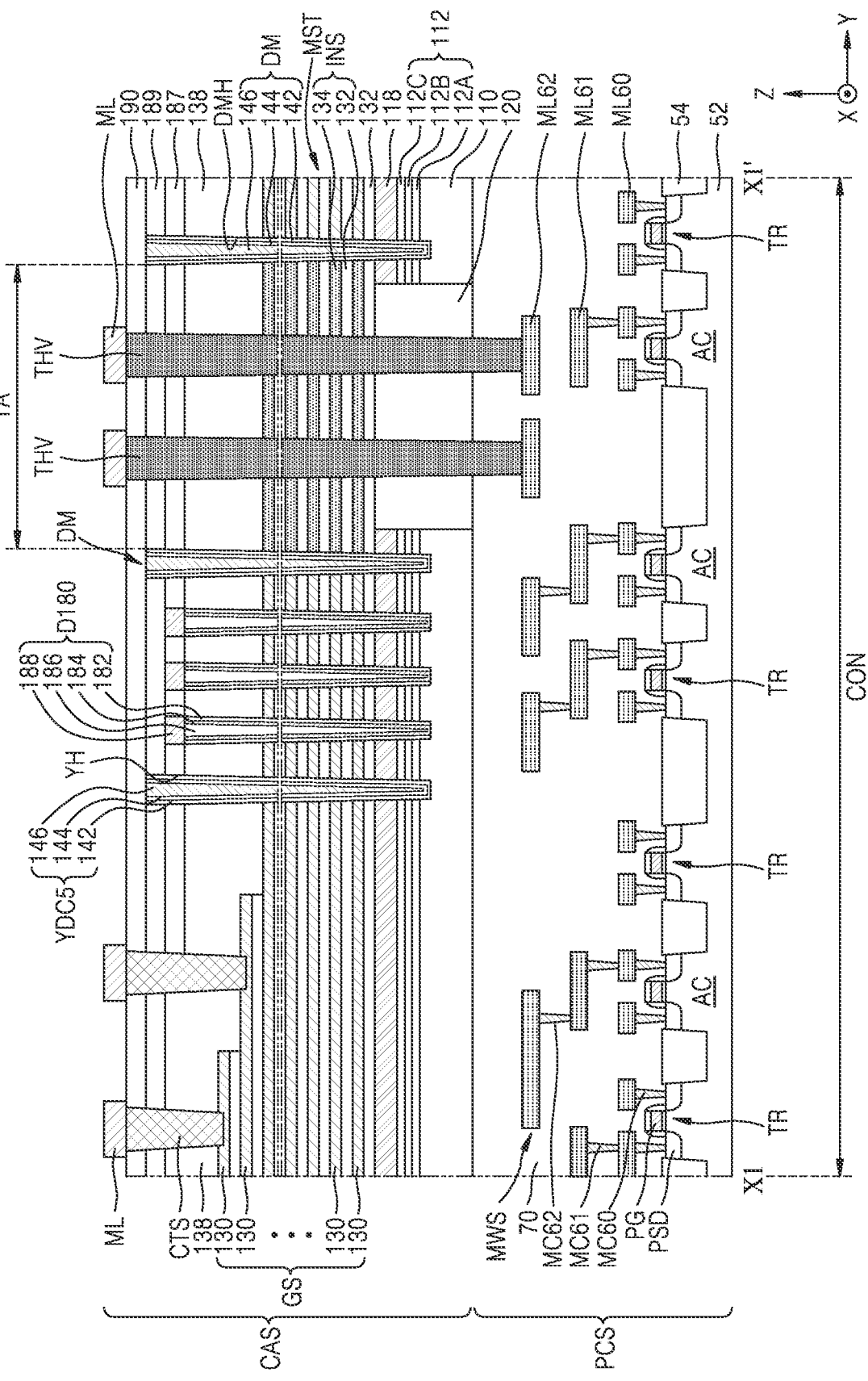
FIG. 9 is a cross-sectional view of a semiconductor device according to some embodiments of the inventive concept.

FIG. 9 is a cross-sectional view of a semiconductor device 500 according to some embodiments of the inventive concept. In FIG. 9, enlarged cross-sectional configurations of some elements of a region corresponding to a cross-sectional surface taken along the line X1-X1' of FIG. 5A in the semiconductor device 500 are illustrated. In FIG. 9, the same reference numerals as FIGS. 5A to 5E refer to like elements, and their detailed descriptions may be omitted.

Referring to FIG. 9, the semiconductor device 500 may include substantially the same elements as those of the semiconductor device 100 described above with reference to FIGS. 5A to 5E. However, the semiconductor device 500 may include an intersection direction cut structure YDC5. The intersection direction cut structure YDC5 may include substantially the same elements as those of the intersection direction cut structure YDC described above with reference to FIGS. 5A and 5B. A material of the intersection direction cut structure YDC5 may be the same as that of the dam structure DM. That is, similar to the dam structure DM described above with reference to FIGS. 5B and 5C, the intersection direction cut structure YDC5 may include a first insulation liner 142, a second insulation liner 144, and a main plug 146, which are sequentially stacked toward an inner portion of a dam hole DMH from an inner wall of the intersection direction hole YH. In example embodiments, the first insulation liner 142 may include, for example, silicon oxide, the second insulation liner 144 may include, for example, silicon nitride, and the main plug 146 may include, for example, polysilicon. However, the inventive concept is not limited thereto.

Figure 10A:
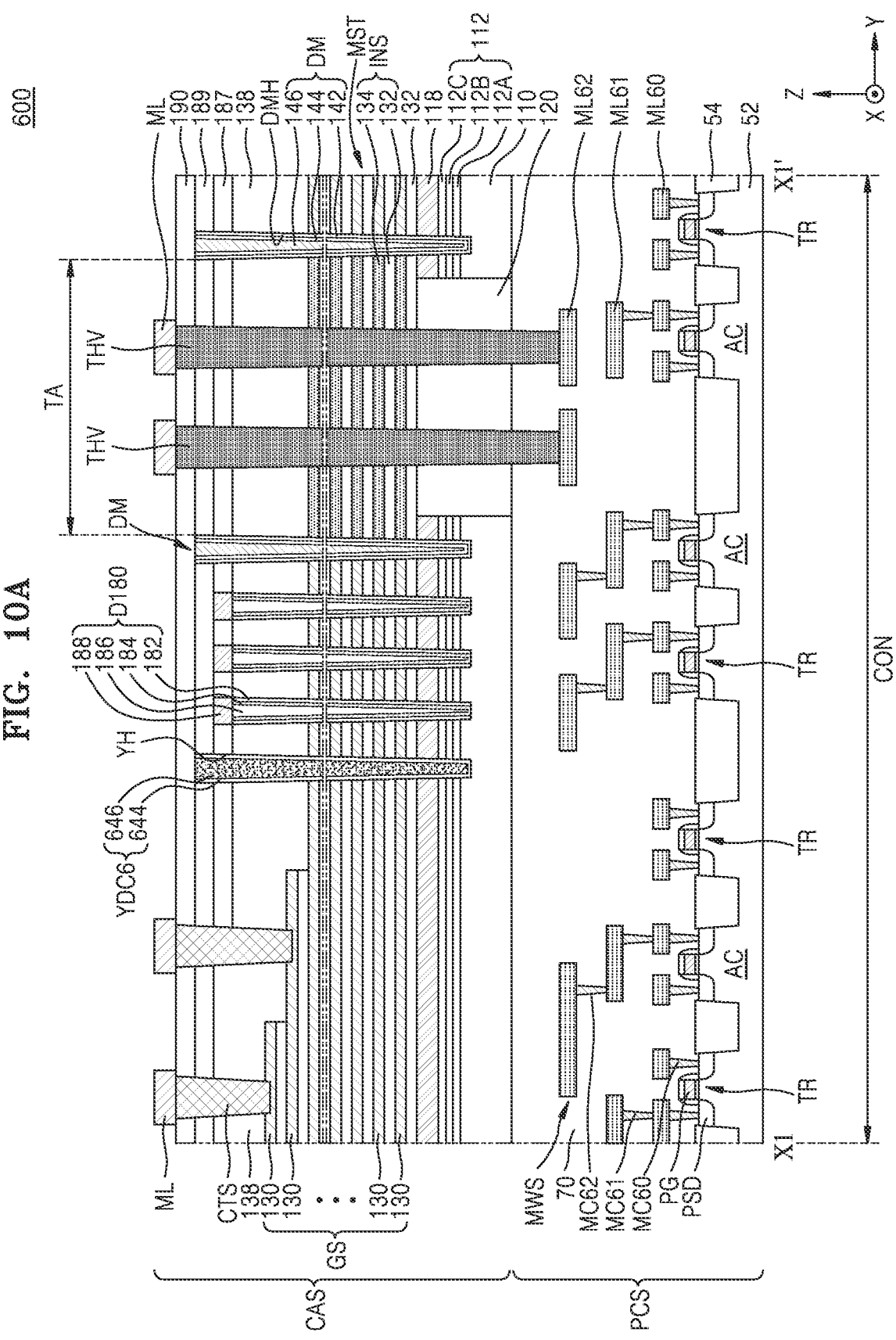
FIGS. 10A and 10B are cross-sectional views of a semiconductor device according to some embodiments of the inventive concept.
Figure 10B:
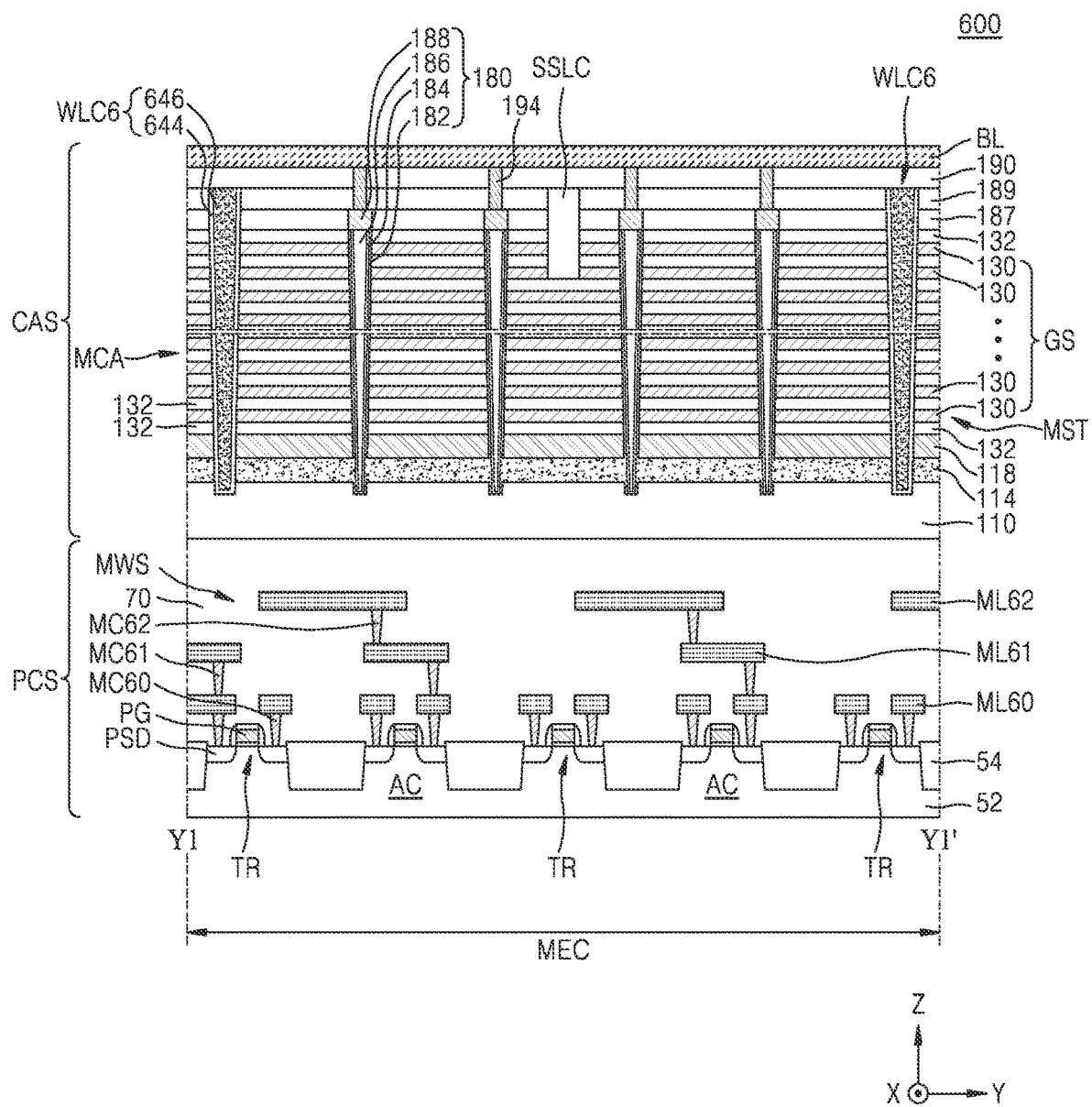

FIGS. 10A and 10B are cross-sectional views of a semiconductor device 600 according to some embodiments of the inventive concept. In FIG. 10A, enlarged cross-sectional configurations of some elements of a region corresponding to a cross-sectional surface taken along the line X1-X1' of FIG. 5A in the semiconductor device 600 are illustrated. In FIG. 10B, enlarged cross-sectional configurations of some elements of a region corresponding to a cross-sectional surface taken along the line Y1-Y1' of FIG. 5A in the semiconductor device 600 are illustrated. In FIGS. 10A and 10B, the same reference numerals as FIGS. 5A to 5E refer to like elements, and their detailed descriptions may be omitted.

Referring to FIGS. 10A and 10B, the semiconductor device 600 may include substantially the same elements as those of the semiconductor device 100 described above with reference to FIGS. 5A to 5E. The semiconductor device 600 may include an intersection direction cut structure YDC6 and a plurality of word line cut structures WLC6. The intersection direction cut structure YDC6 and the plurality of word line cut structures WLC6 may include substantially the same elements as those of the intersection direction cut structure YDC and the word line cut structure WLC each described above with reference to FIGS. 5A and 5B. The intersection direction cut structure YDC6 and the plurality of word line cut structures WLC6 may each include an insulation liner 644 and a main plug 646 surrounded by the insulation liner 644. In example embodiments, the insulation liner 644 may include, for example, a silicon oxide layer, and the main plug 646 may include, for example, a metal layer. For example, the metal layer included in the main plug 646 may include a W layer.

Figure 11:
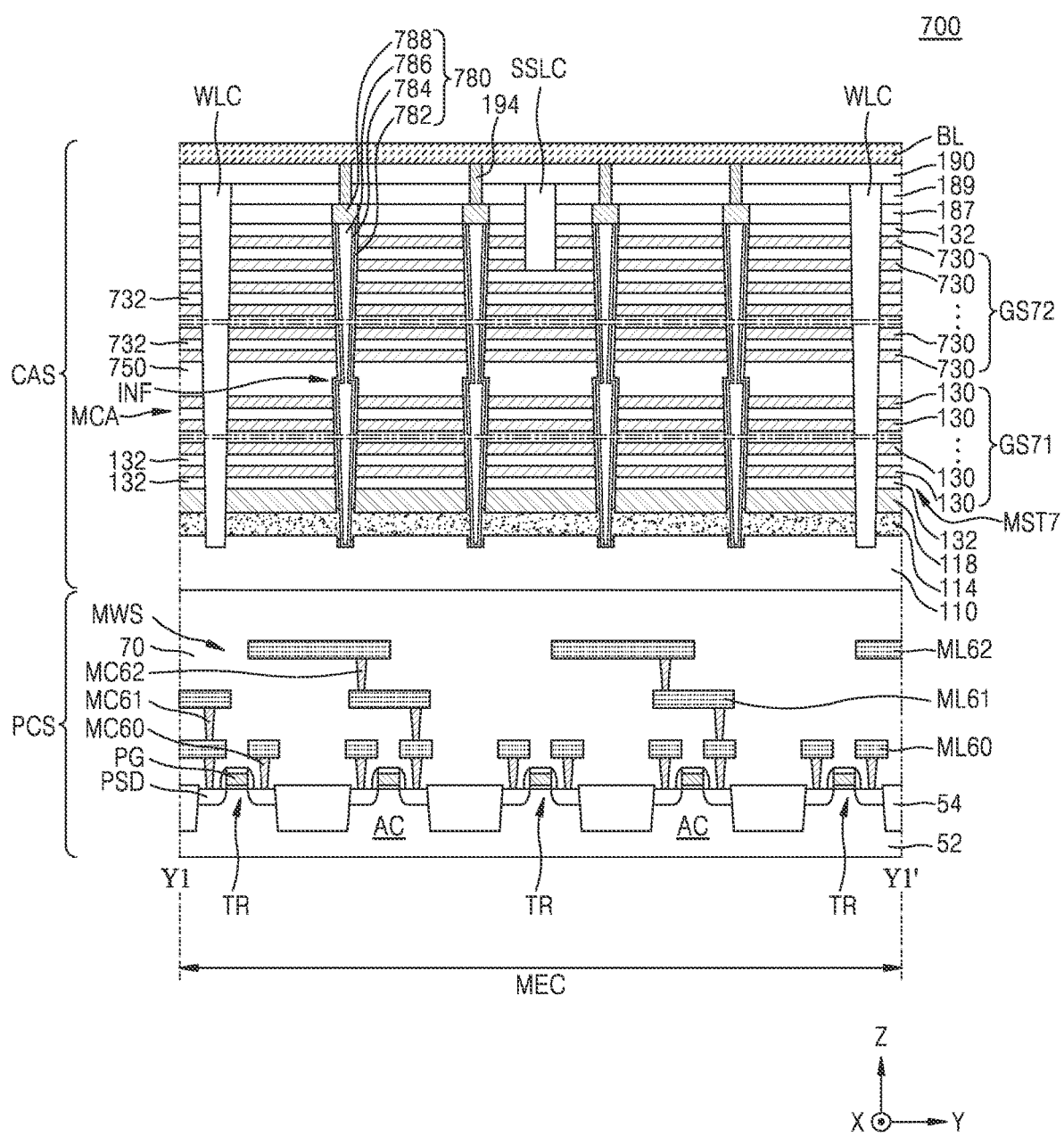
FIG. 11 is a cross-sectional view of a semiconductor device according to some embodiments of the inventive concept.

FIG. 11 is a cross-sectional view of a semiconductor device 700 according to some embodiments of the inventive concept. In FIG. 11, enlarged cross-sectional configurations of some elements of a region corresponding to a cross-sectional surface taken along the line Y1-Y1' of FIG. 5A in the semiconductor device 700 are illustrated. In FIG. 11, the same reference numerals as FIGS. 5A to 5E refer to like elements, and their detailed descriptions may be omitted.

Referring to FIG. 11, the semiconductor device 700 may include substantially the same elements as those of the semiconductor device 100 described above with reference to FIGS. 5A to 5E. However, the semiconductor device 700 may include a memory stack structure MST7 instead of the memory stack structure MST of the semiconductor device 100.

The memory stack structure MST7 may include a lower gate stack GS71 including a plurality of gate lines 130 and an upper gate stack GS72 including a plurality of gate lines 730. In the lower gate stack GS71, an insulation layer 132 may be disposed between two adjacent gate lines 130 of the plurality of gate lines 130. In the upper gate stack GS72, an insulation layer 732 may be disposed between two adjacent gate lines 730 of the plurality of gate lines 730. A middle insulation layer 750 having a greater thickness than that of the insulation layer 132 or the insulation layer 732 may be disposed between the lower gate stack GS71 and the upper gate stack GS72. The insulation layer 732 and the middle insulation layer 750 may each include, for example, silicon oxide.

In example embodiments, the lower gate stack GS71 may include 48, 64, or 96 gate lines 130, which are stacked to overlap in a vertical direction (a Z direction), and the upper gate stack GS72 may include 48, 64, or 96 gate lines 730, which are stacked to overlap in the vertical direction (the Z direction). In example embodiments, a sum of the number of gate lines 130 of the lower gate stack GS71 and the number of gate lines 730 of the lower gate stack GS72 may be at least 128.

In a memory cell region MEC of a cell array structure CAS, a plurality of channel structures 780 may pass through a plurality of gate lines 730, a plurality of insulation layers 732, the middle insulation layer 750, the plurality of gate lines 130, a plurality of insulation layers 132, a second conductive plate 118, and a first conductive plate 114, may extend longitudinally in the vertical direction (the Z direction), may be on the upper substrate 110.

The plurality of channel structures 780 may include a gate dielectric layer 782, a channel region 784, a buried insulation layer 786, and a drain region 788. The gate dielectric layer 782, the channel region 784, the buried insulation layer 786, and the drain region 788 may be the same as or similar to those of the gate dielectric layer 182, the channel region 184, the buried insulation layer 186, and the drain region 188 included in the channel structure 180 described above with reference to FIGS. 5A and 5C. Each of the gate dielectric layer 782, the channel region 784, and the buried insulation layer 786 each included in the plurality channel structures 780 may include an inflection portion in a region surrounded by the middle insulation layer 750. In example embodiments, in order to form the plurality of channel structures 780 in a process of manufacturing a semiconductor device 700, a lower channel hole passing through a lower mold structure including the plurality of insulation layers 132 may be formed first, and then, an upper channel hole passing through an upper mold structure including the plurality of insulation layers 732 and communicating with the lower channel hole may be formed in a state where a sacrificial layer is filled into the lower channel hole, thereby forming a channel hole having a two-step structure needed for forming the plurality of channel structure 780. Subsequently, the gate dielectric layer 782, the channel region 784, and the buried insulation layer 786 may be formed in the channel hole having a two-step structure. In this case, a portion of a lower portion of the middle insulation layer 750 may include an insulation layer included in the lower mold structure, and a portion of an upper portion of the middle insulation layer 750 may include an insulation layer included in the lower mold structure. While the gate dielectric layer 782, the channel region 784, and the buried insulation layer 786 are being formed in the channel hole having a two-step structure, the inflection portion INF may be formed in each of the gate dielectric layer 782, the channel region 784, and the buried insulation layer 786 on the basis of a horizontal-direction width difference between the lower channel hole and the upper channel hole, near a portion at which the lower channel hole contacts the upper channel hole.

More detailed configurations of the gate dielectric layer 782, the channel region 784, the buried insulation layer 786, and the drain region 788 may be substantially the same as those of the gate dielectric layer 182, the channel region 184, the buried insulation layer 186, and the drain region 188 each described above with reference to FIGS. 5A to 5C. Although not shown, the plurality of dummy channel structures D180 described above with reference to FIGS. 5A and 5B may be disposed in a connection region CON of the semiconductor device 700. A cross-sectional structure of each of the plurality of dummy channel structures D180 may have a structure similar to that of each of the plurality of channel structures 780 described above with reference to FIG. 11.

Figure 12A:
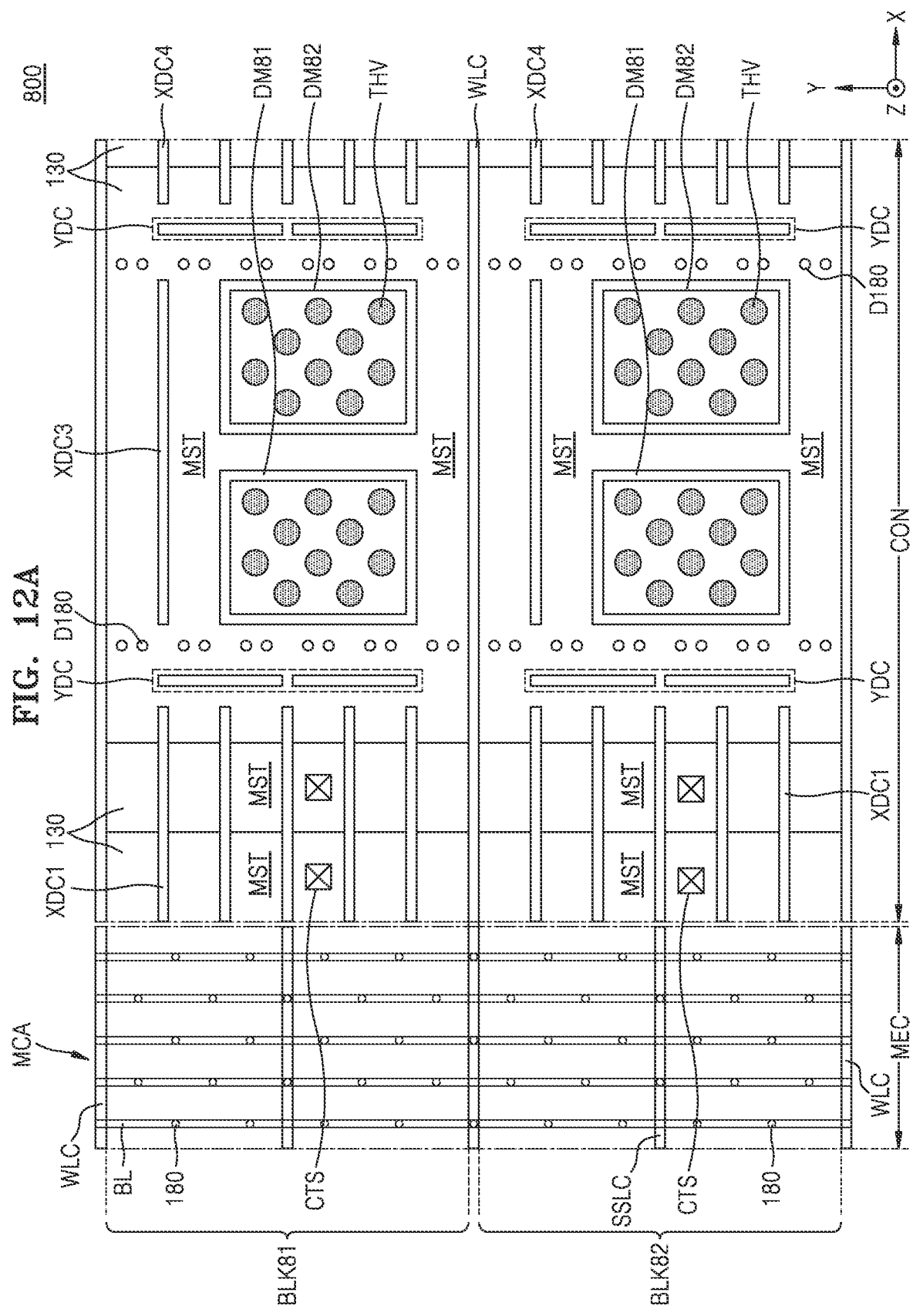
FIG. 12A is a plan view of a semiconductor device according to some embodiments of the inventive concept.

FIG. 12A is a plan view of a semiconductor device 800 according to some embodiments of the inventive concept. In FIG. 12A, the same reference numerals as FIGS. 5A to 5E refer to like elements, and their detailed descriptions may be omitted. FIG. 12A illustrates some elements of memory cell blocks BLK81 and BLK82 capable of configuring the plurality of memory cell blocks BLK1, BLK2, . . . , and BLKp illustrated in FIG. 4.

Referring to FIG. 12A, the semiconductor device 800 may include the same elements as those of the semiconductor device 100 described above with reference to FIGS. 5A to 5E. The semiconductor device 800 may include a plurality of dam structures DM81 and DM82 which are spaced apart from each other in a first horizontal direction (an X direction) between two adjacent word line cut structures WLC in a connection region CON of a cell array structure CAS. An intersection direction cut structure YDC may be disposed adjacent (e.g., at) each of opposing sides in the first horizontal direction (the X direction) with the plurality of dam structures DM81 and DM82 therebetween. A portion of the memory stack structure MST may be disposed in a space between the plurality of dam structures DM81 and DM82 apart from each other in the first horizontal direction (the X direction). A plurality of through vias THV may be disposed in each of the plurality of dam structures DM81 and DM82.

A plurality of dummy channel structures D180 may be disposed between the intersection direction cut structure YDC and the plurality of dam structures DM81 and DM82. The plurality of dummy word line cut structures XDC2 illustrated in FIG. 5A may not be disposed between the intersection direction cut structure YDC and the plurality of dam structures DM81 and DM82.

In FIG. 12A, a configuration where the intersection direction cut structure YDC extends linearly and longitudinally in a second horizontal direction (a Y direction) as described above with reference to FIGS. 5A and 5D is illustrated, but the inventive concept is not limited thereto. The semiconductor device 800 illustrated in FIG. 12A may use an intersection direction cut structure having a structure which extends nonlinearly and longitudinally in a direction intersecting with the word line cut structure WLC between two adjacent word line cut structures WLC like the intersection direction cut structure YDC3 illustrated in FIG. 7 or the intersection direction cut structure YDC4 illustrated in FIG. 8, instead of the intersection direction cut structure YDC.

Figure 12B:
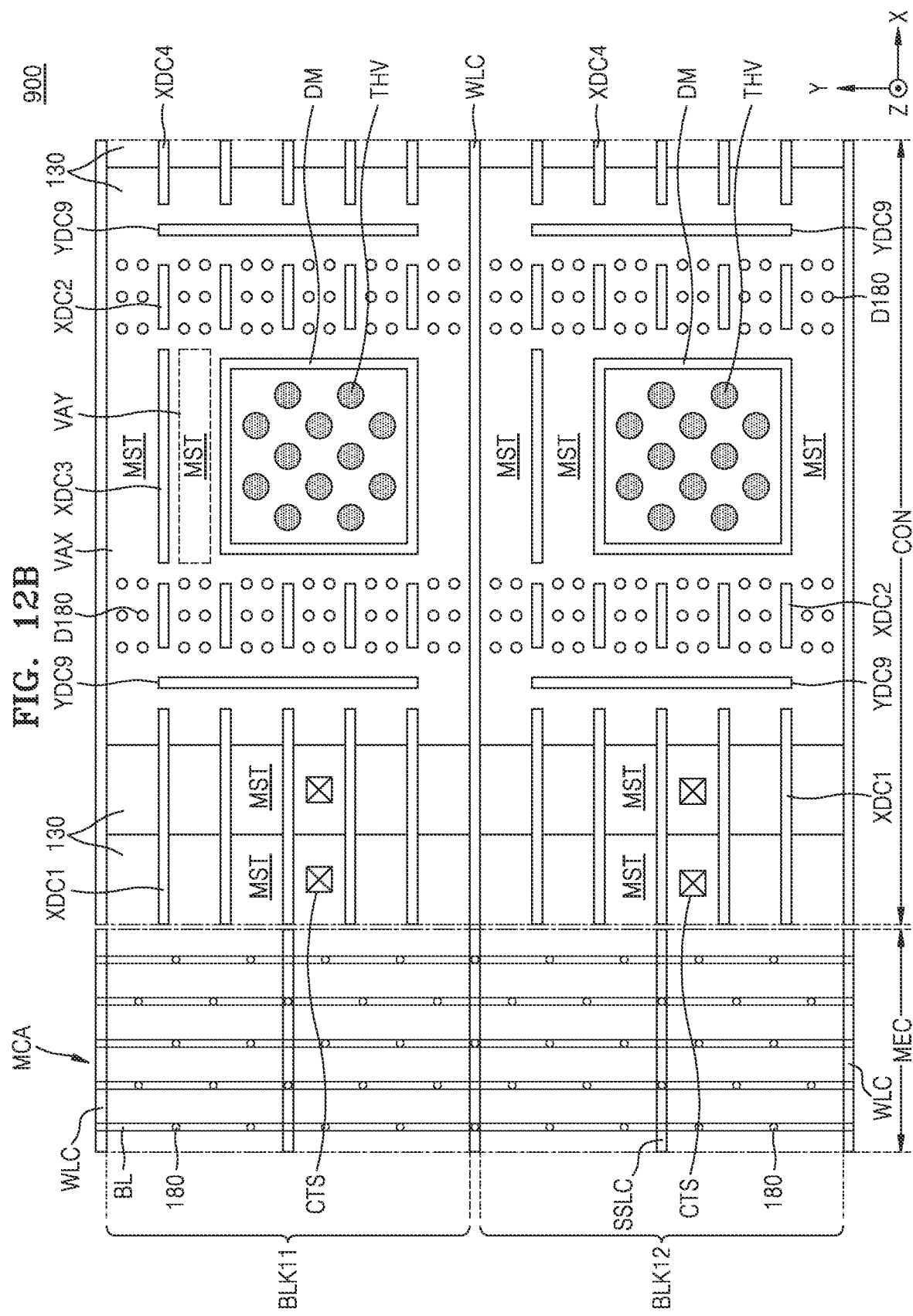
FIG. 12B is a plan view of a semiconductor device according to some embodiments of the inventive concept.

FIG. 12B is a plan view of a semiconductor device 900 according to some embodiments of the inventive concept. In FIG. 12B, the same reference numerals as FIGS. 5A to 5E refer to like elements, and their detailed descriptions may be omitted.

Referring to FIG. 12B, the semiconductor device 900 may include substantially the same elements as those of the semiconductor device 100 described above with reference to FIGS. 5A to 5E. However, the semiconductor device 900 may include an intersection direction cut structure YDC9. The intersection direction cut structure YDC9 may include substantially the same elements as those of the intersection direction cut structure YDC described above with reference to FIGS. 5A and 5B. The intersection direction cut structure YDC9 may include one cut line which extends longitudinally in a second horizontal direction (a Y direction) between two adjacent word line cut structures WLC.

In FIG. 12B, a configuration where the intersection direction cut structure YDC9 extends linearly and longitudinally in the second horizontal direction (the Y direction) as described above with reference to FIGS. 5A and 5D is illustrated, but the inventive concept is not limited thereto. The semiconductor device 900 illustrated in FIG. 12B may use one intersection direction cut structure having a structure which extends nonlinearly and longitudinally in a direction intersecting with the word line cut structure WLC between two adjacent word line cut structures WLC like the intersection direction cut structure YDC3 illustrated in FIG. 7 or the intersection direction cut structure YDC4 illustrated in FIG. 8, instead of the intersection direction cut structure YDC9.

A method of manufacturing a semiconductor device according to some embodiments of the inventive concept will be described in detail.

FIGS. 13A to 18B are cross-sectional views illustrating a method of manufacturing a semiconductor device, according to some embodiments. Particularly, FIGS. 13A, 14A, 15A, 16A, 17A and 18A are cross-sectional views taken along the line X1-X1' of FIG. 5A, and FIGS. 13B, 14B, 15B, 16B, 17B and 18B are cross-sectional views taken along the line Y1-Y1' of FIG. 5A. A method of manufacturing the semiconductor device 100 described above with reference to FIGS. 5A to 5E will be described with reference to FIGS. 13A to 18B.

Figure 13A:
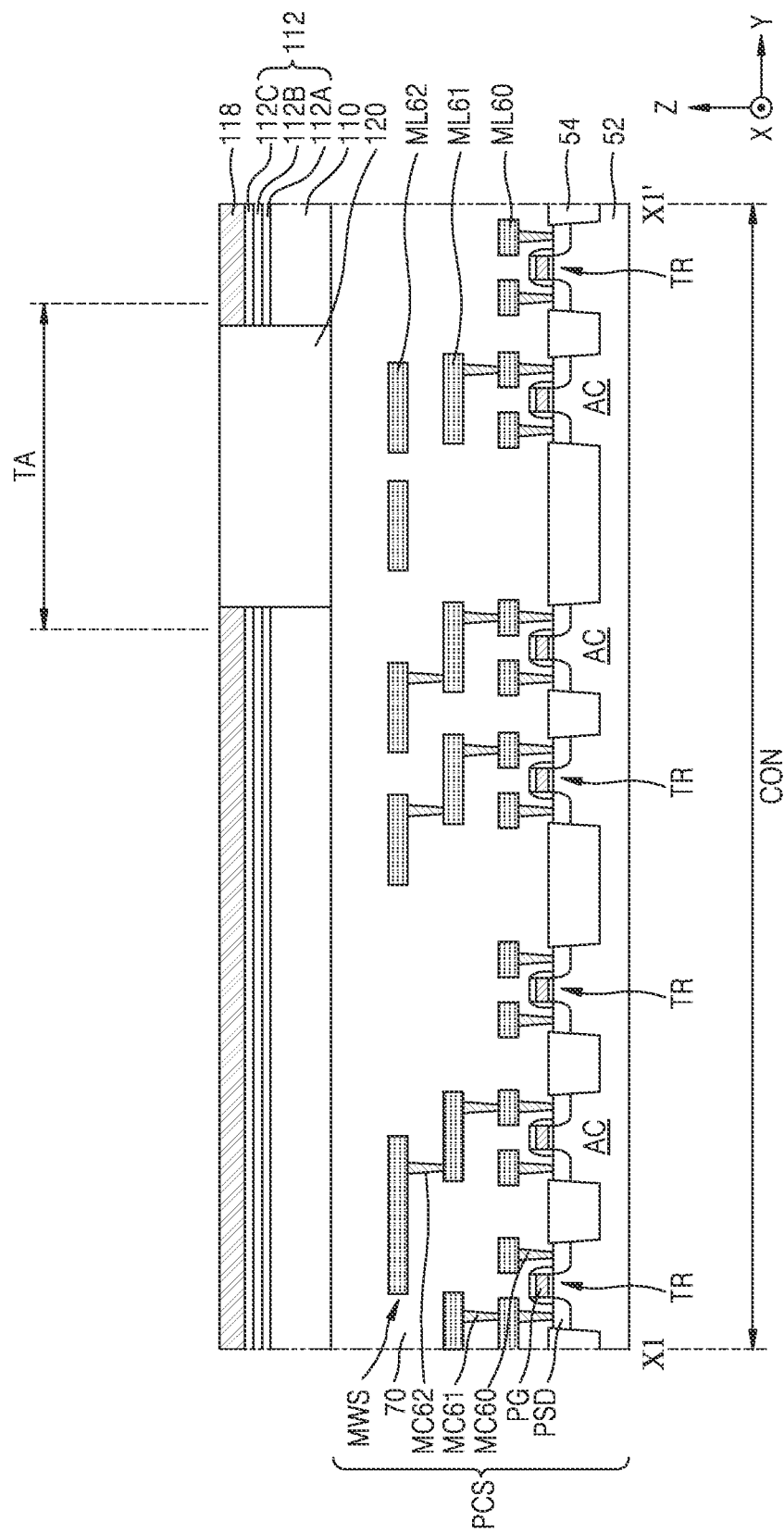
FIGS. 13A, 13B, 14A, 14B, 15A, 15B, 16A, 16B, 17A, 17B, 18A, and 18B are cross-sectional views illustrating methods of manufacturing a semiconductor device, according to some embodiments of the inventive concept.
Figure 13B:
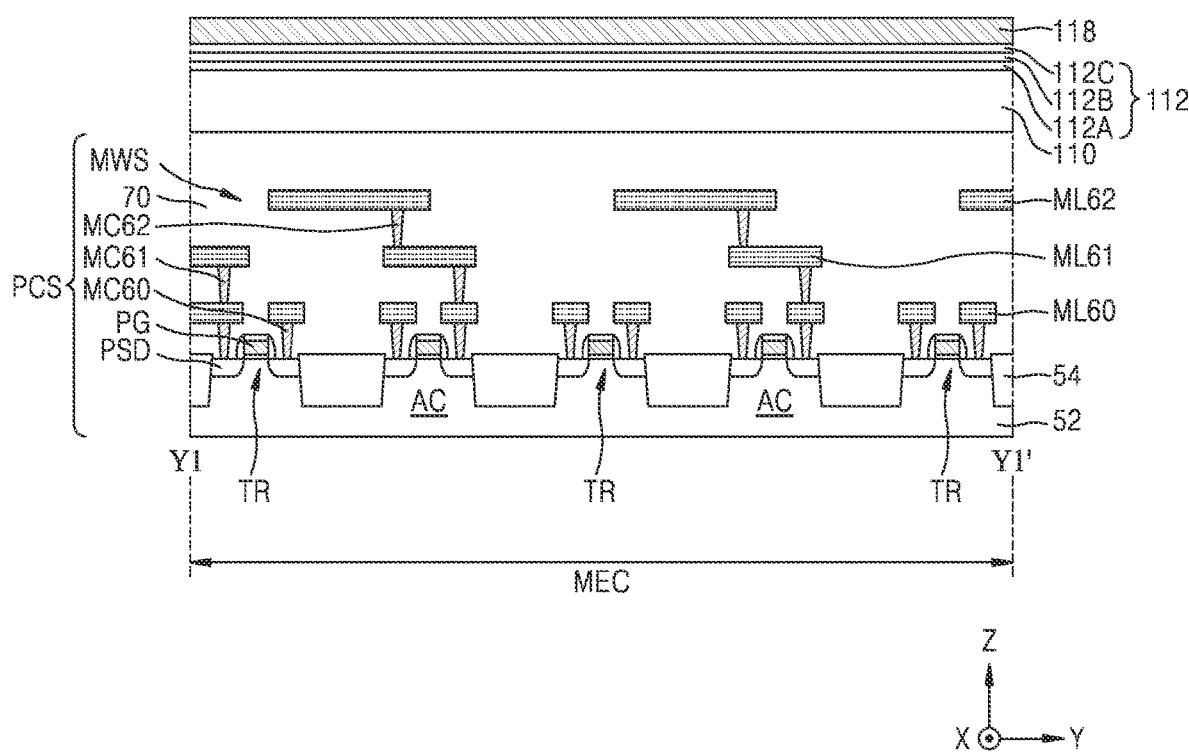

Referring to FIGS. 13A and 13B, a peripheral circuit structure PCS including a memory lower substrate 52, a plurality of transistors TR, a multilayer wiring structure MWS, and an interlayer insulation layer 70 may be formed.

An upper substrate 110 may be formed on the interlayer insulation layer 70 of the peripheral circuit structure PCS, and an insulation plate 112 and a second conductive plate 118 each covering the upper substrate 110 may be sequentially formed in a memory cell region MEC and a connection region CON of a cell array structure CAS (see FIGS. 5B and 5C) which is to be formed on the peripheral circuit structure PCS. The insulation plate 112 may include an insulation layer having a multilayer structure, which may include a first insulation layer 112A, a second insulation layer 112B, and a third insulation layer 112C.

A through hole passing through the upper substrate 110, the insulation plate 112, and the second conductive plate 118 may be formed at a position corresponding to a through via region TA (see FIG. 5B) of the connection region CON, and an insulation plug 120 filling the through hole may be formed.

Figure 14A:
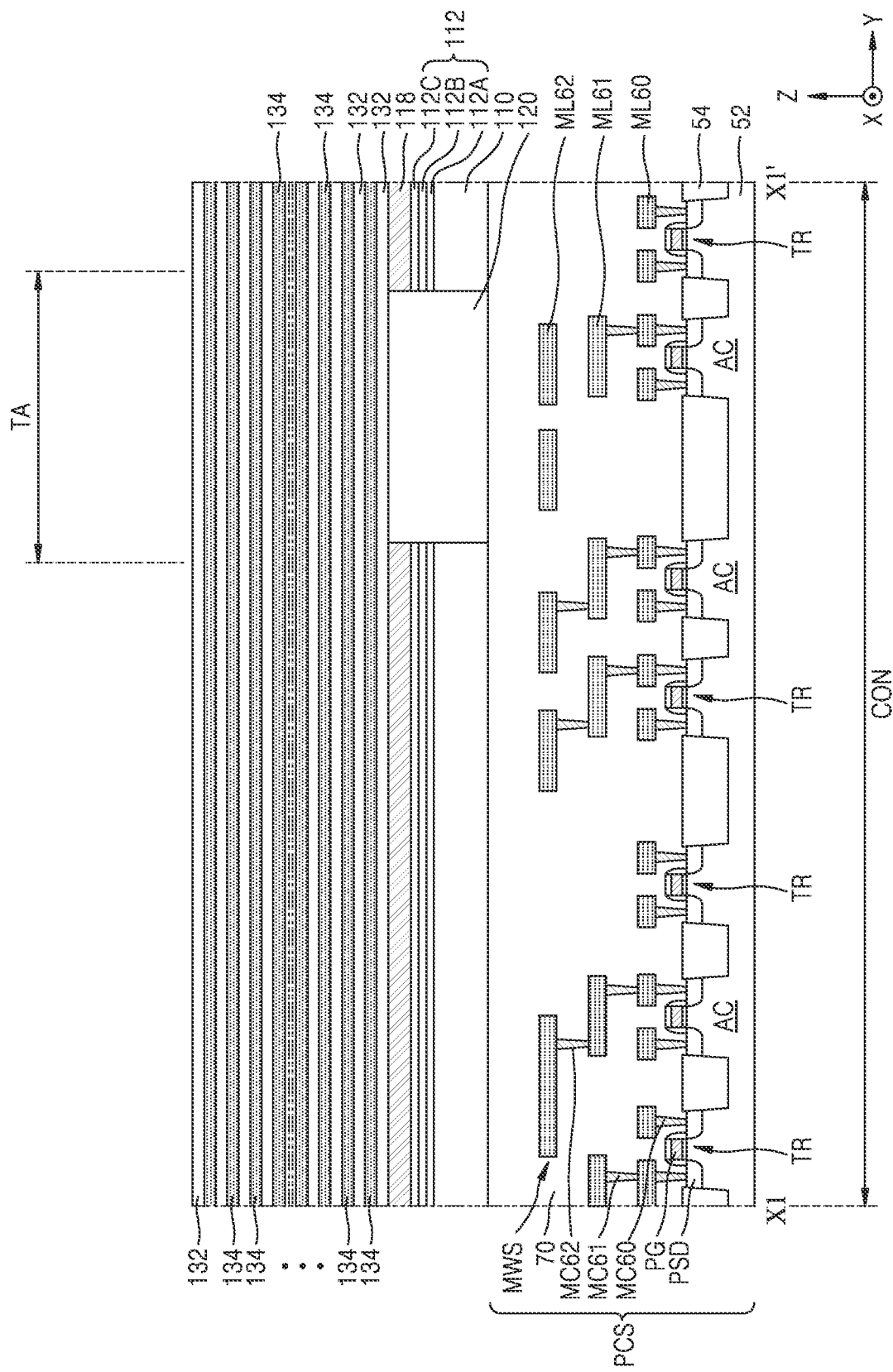
Figure 14B:
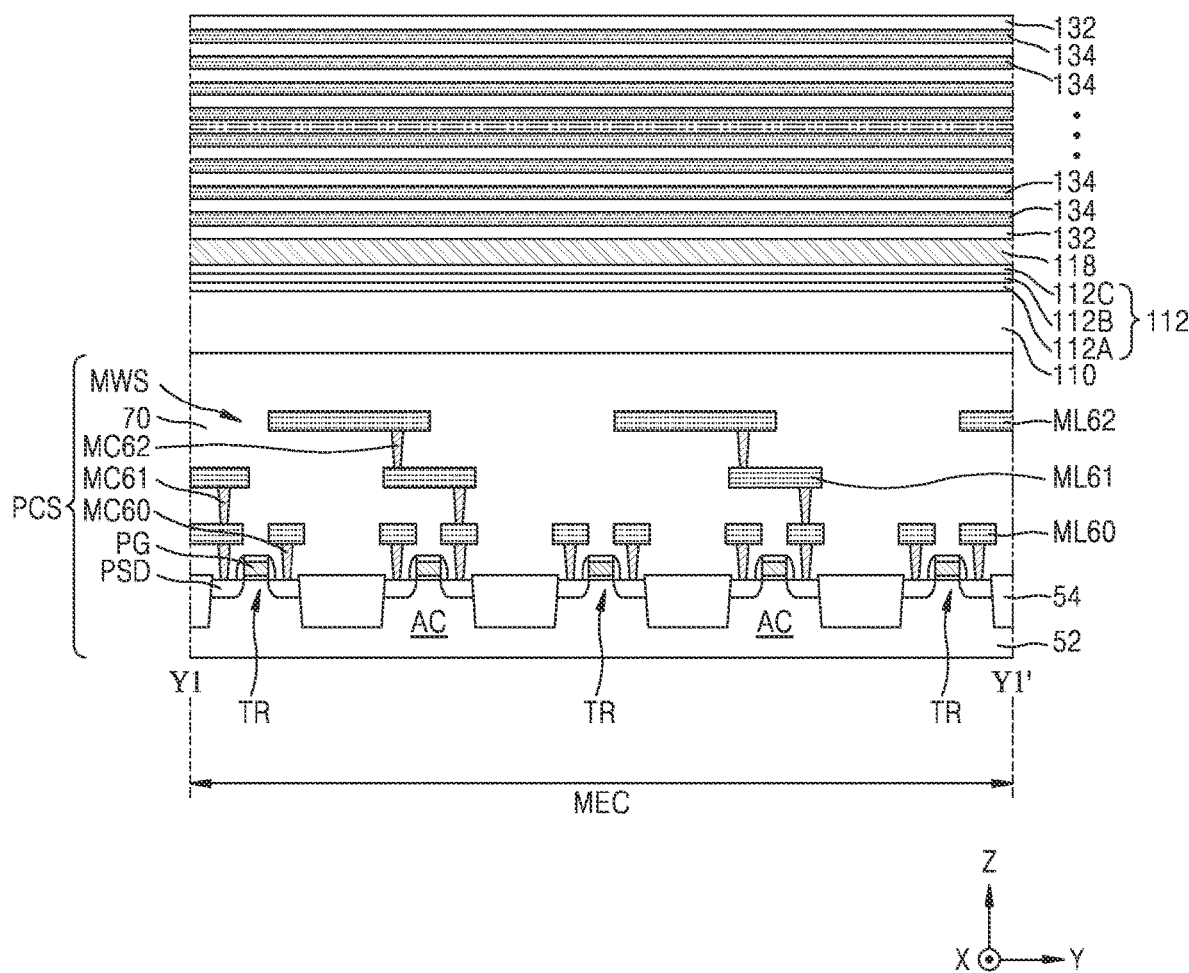

Referring to FIGS. 14A and 14B, in the memory cell region MEC and the connection region CON, a plurality of insulation layers 132 and a plurality of sacrificial insulation layers 134 may be alternately stacked on a second conductive plate 118 and an insulation plug 120. The plurality of insulation layers 132 may include, for example, silicon oxide, and the plurality of sacrificial insulation layers 134 may include, for example, silicon nitride. Each of the plurality of sacrificial insulation layers 134 may secure a space for forming a plurality of gate lines 130 performed in subsequent processes.

Figure 15A:
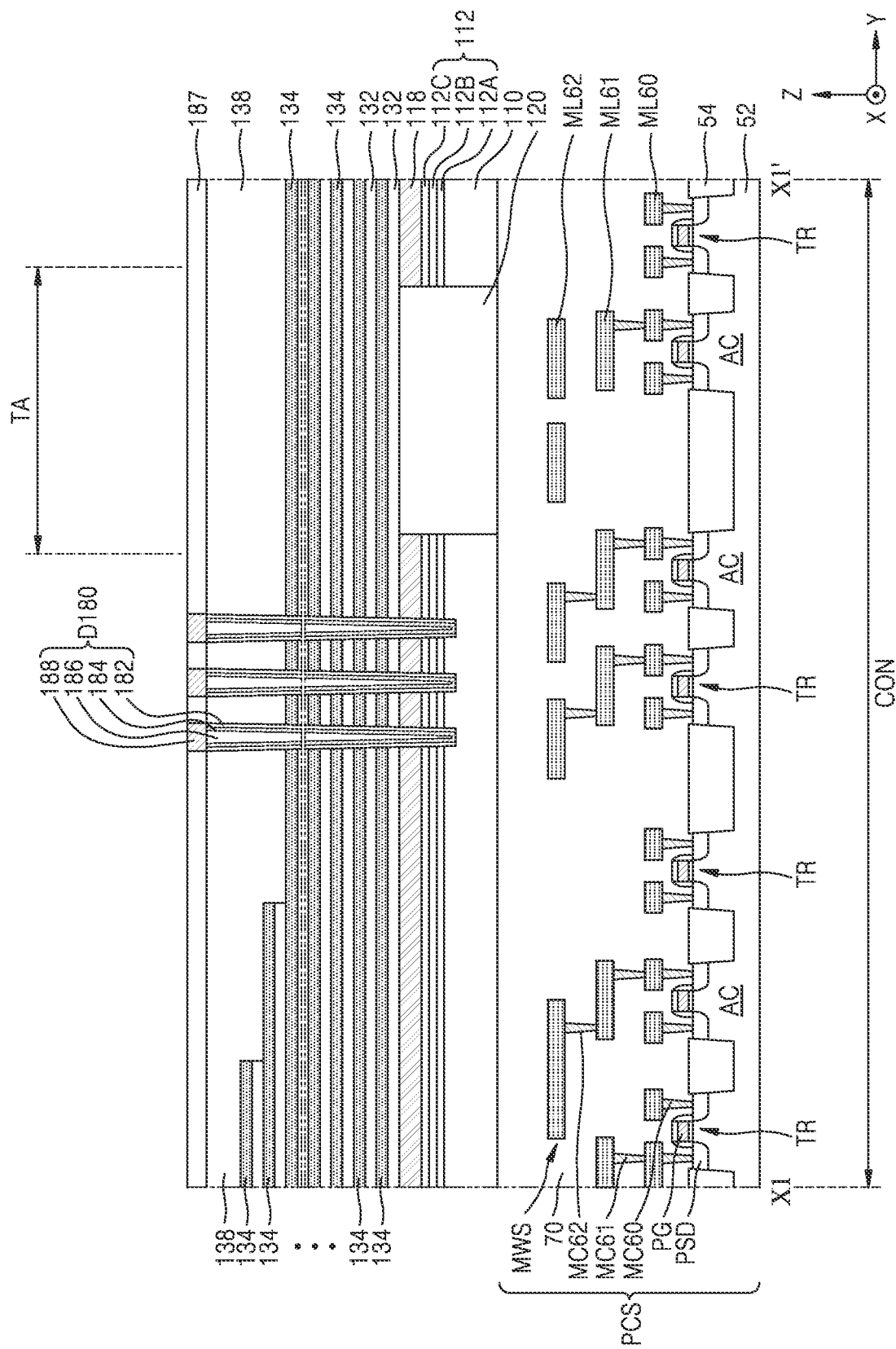
Figure 15B:
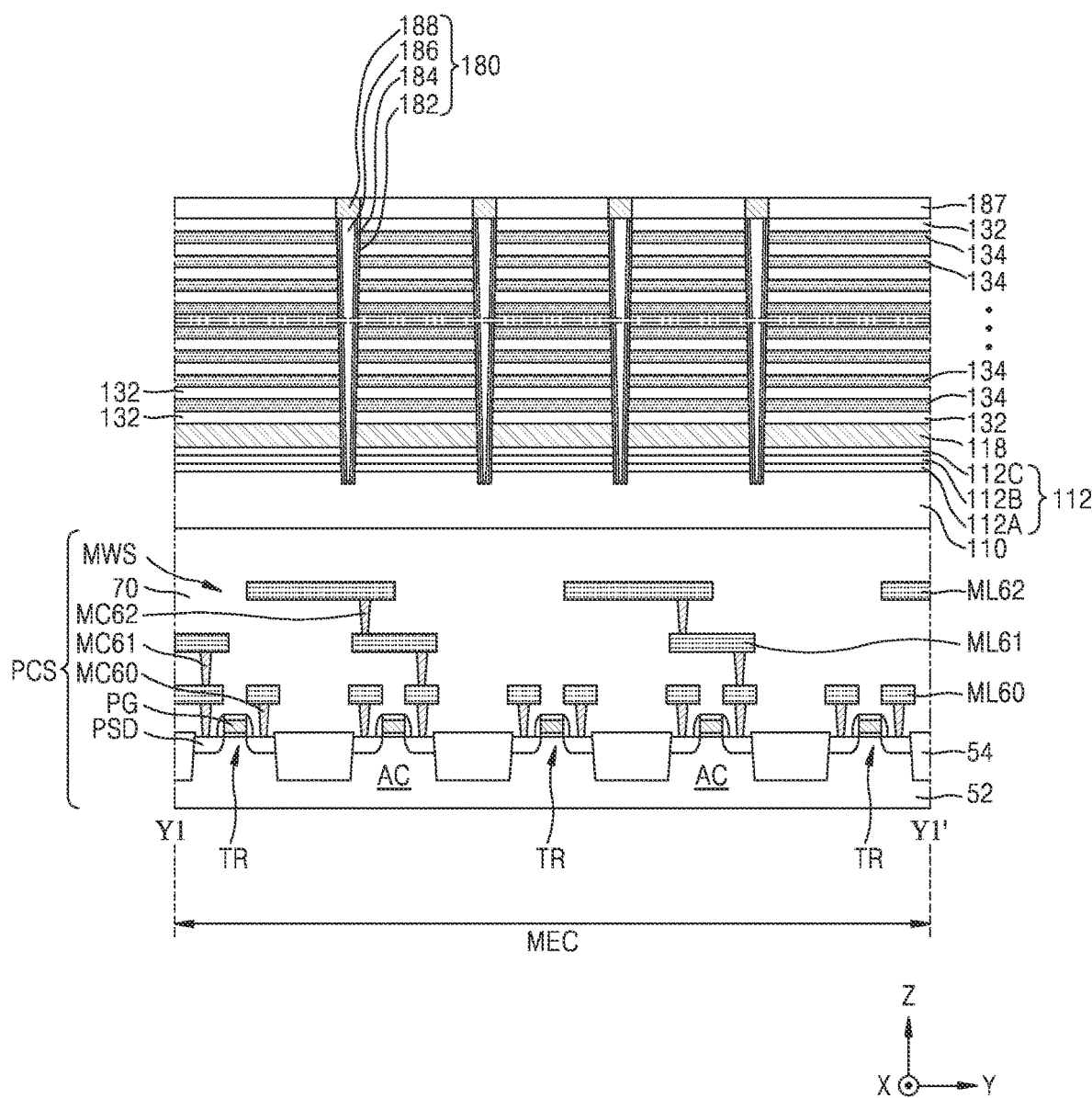

Referring to FIGS. 15A and 15B, in the connection region CON, a portion of each of the plurality of insulation layers 132 and the plurality of sacrificial insulation layers 134 may be removed to form a staircase structure having a width which is progressively reduced in a horizontal direction as the plurality of insulation layers 132 and the plurality of sacrificial insulation layers 134 distance from an upper substrate 110. Subsequently, an interlayer insulation layer 138 may be formed to cover an edge portion of each of the plurality of insulation layers 132 and the plurality of sacrificial insulation layers 134 forming the staircase structure in the connection region CON. After the interlayer insulation layer 138 is formed, a top surface of an uppermost insulation layer 132 of the plurality of insulation layers 132 in the memory cell region MEC and a top surface of the interlayer insulation layer 138 in the connection region CON may be at the same level from the upper substrate 110.

A plurality of channel structures 180, passing through the plurality of insulation layers 132 and the plurality of sacrificial insulation layers 134 and extending longitudinally in a vertical direction (a Z direction) in the memory cell region MEC, and a plurality of dummy channel structures D180, passing through the plurality of insulation layers 132, the plurality of sacrificial insulation layers 134, and the interlayer insulation layer 138 and extending longitudinally in the vertical direction (the Z direction) in the memory cell region MEC, may be formed. In a process of forming the plurality of channel structures 180 and the plurality of dummy channel structures D180, a gate dielectric layer 182, a channel region 184, and a buried insulation layer 186 may be formed in the memory cell region MEC and the connection region CON, and then, before forming a drain region 188, the uppermost insulation layer 132 of the plurality of insulation layers 132 in the memory cell region MEC and the first upper insulation layer 187 covering the interlayer insulation layer 138 in the connection region CON may be formed. Subsequently, a plurality of drain regions 188 which pass through the first upper insulation layer 187 and is connected to the channel region 184 may be formed.

Figure 16A:
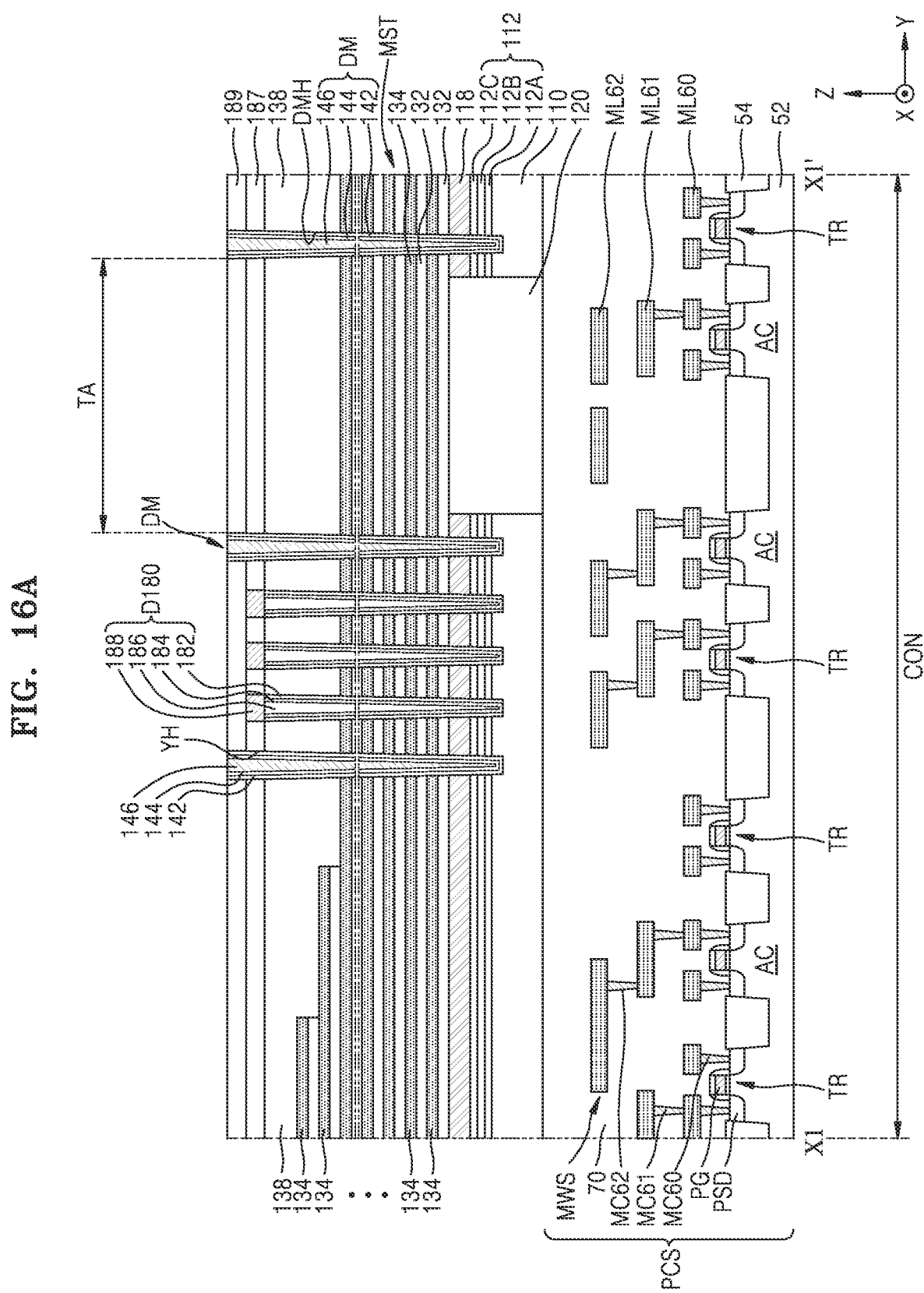
Figure 16B:
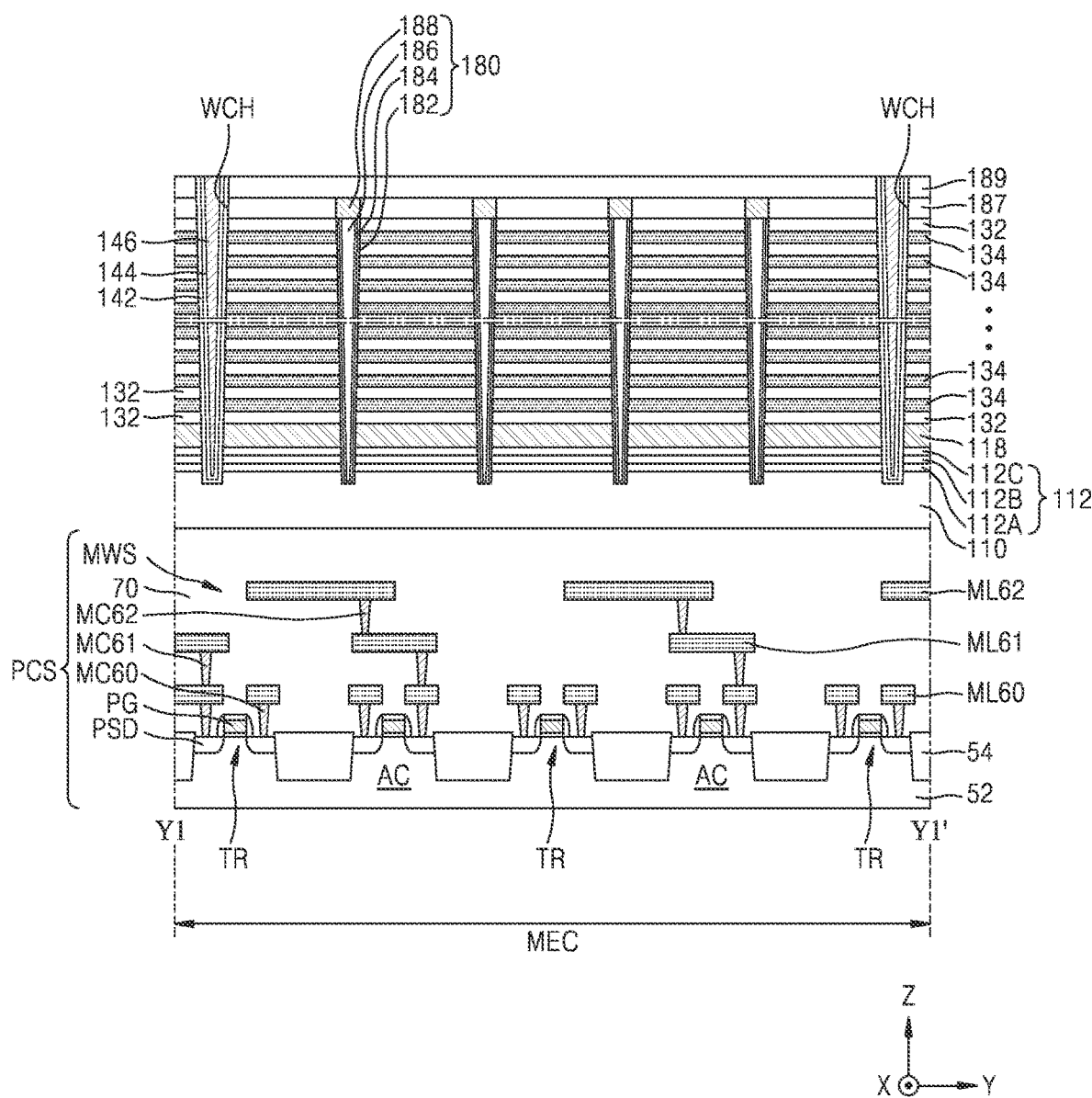

Referring to FIGS. 16A and 16B, a second upper insulation layer 189 covering the plurality of channel structures 180, the plurality of dummy channel structures D180, and the first upper insulation layer 187 may be formed in the memory cell region MEC and the connection region CON.

A plurality of word line cut holes WCH, a plurality of dam holes DMH, and a plurality of intersection direction holes YH, which pass through the second upper insulation layer 189, the first upper insulation layer 187, the plurality of insulation layers 132, the plurality of sacrificial insulation layers 134, the second conductive plate 118, and the insulation plate 112 to expose the upper substrate 110, may be formed in the memory cell region MEC and the connection region CON. While the plurality of word line cut holes WCH, the plurality of dam holes DMH, and the plurality of intersection direction holes YH are being formed, a plurality of dummy holes (not shown) for forming the plurality of dummy word line cut structures XDC1, XDC2, XDC3, and XDC4 illustrated in FIG. 5A may be formed in the connection region CON simultaneously. As used herein, "formed simultaneously" may refer to being formed by the same process(es), at approximately (but not necessarily exactly) the same time.

A first insulation liner 142, a second insulation liner 144, and a main plug 146 may be formed in each of the plurality of word line cut holes WCH, the plurality of dam holes DMH, and the plurality of intersection direction holes YH. At this time, the first insulation liner 142, the second insulation liner 144, and the main plug 146 may be formed in the plurality of dummy holes (not shown) for forming the plurality of dummy word line cut structures XDC1, XDC2, XDC3, and XDC4 illustrated in FIG. 5A in the connection region CON. The first insulation liner 142, the second insulation liner 144, and the main plug 146, which fill the plurality of dam holes DM, may form a plurality of dam structures DM.

Figure 17A:
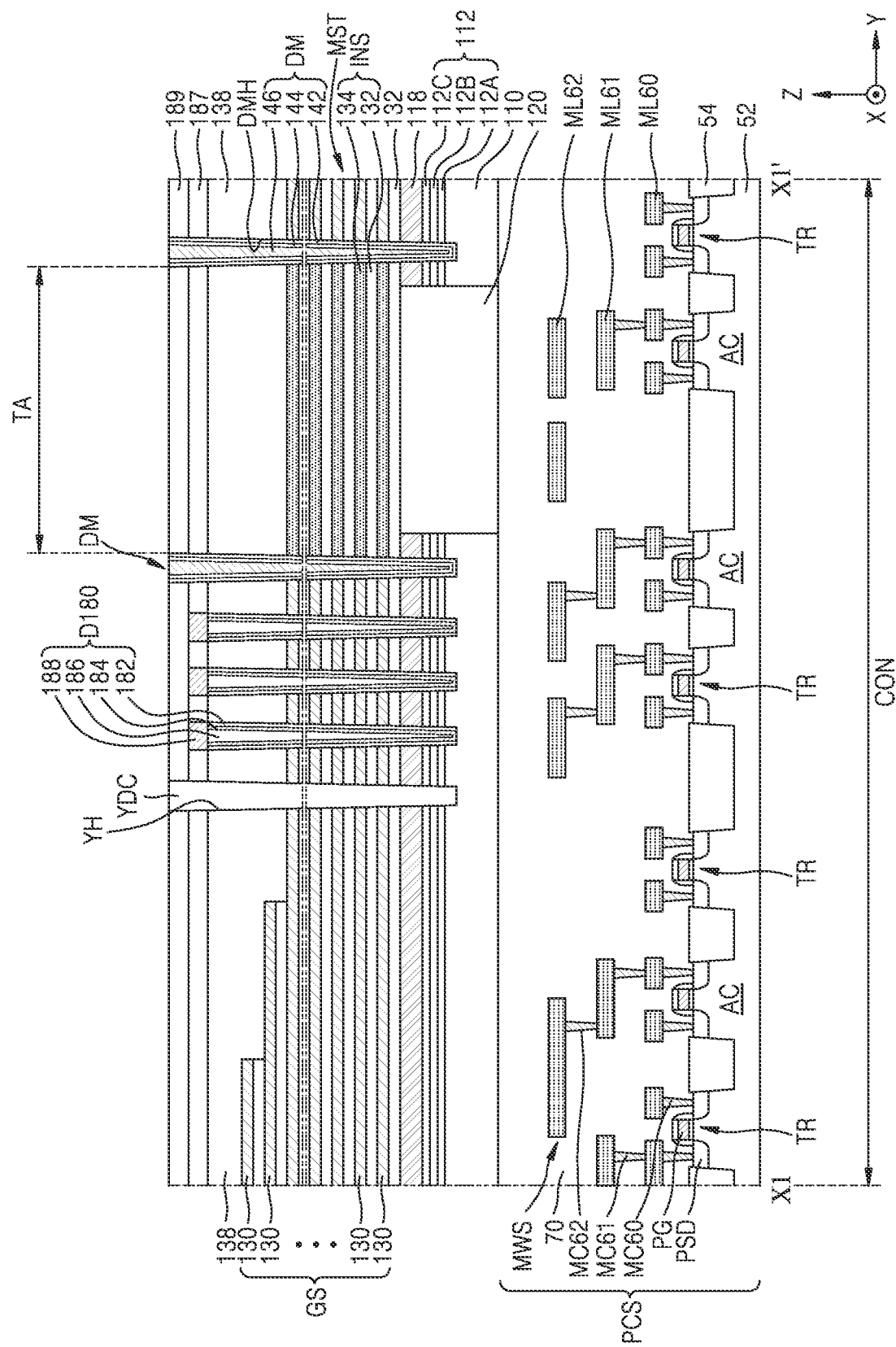
Figure 17B:
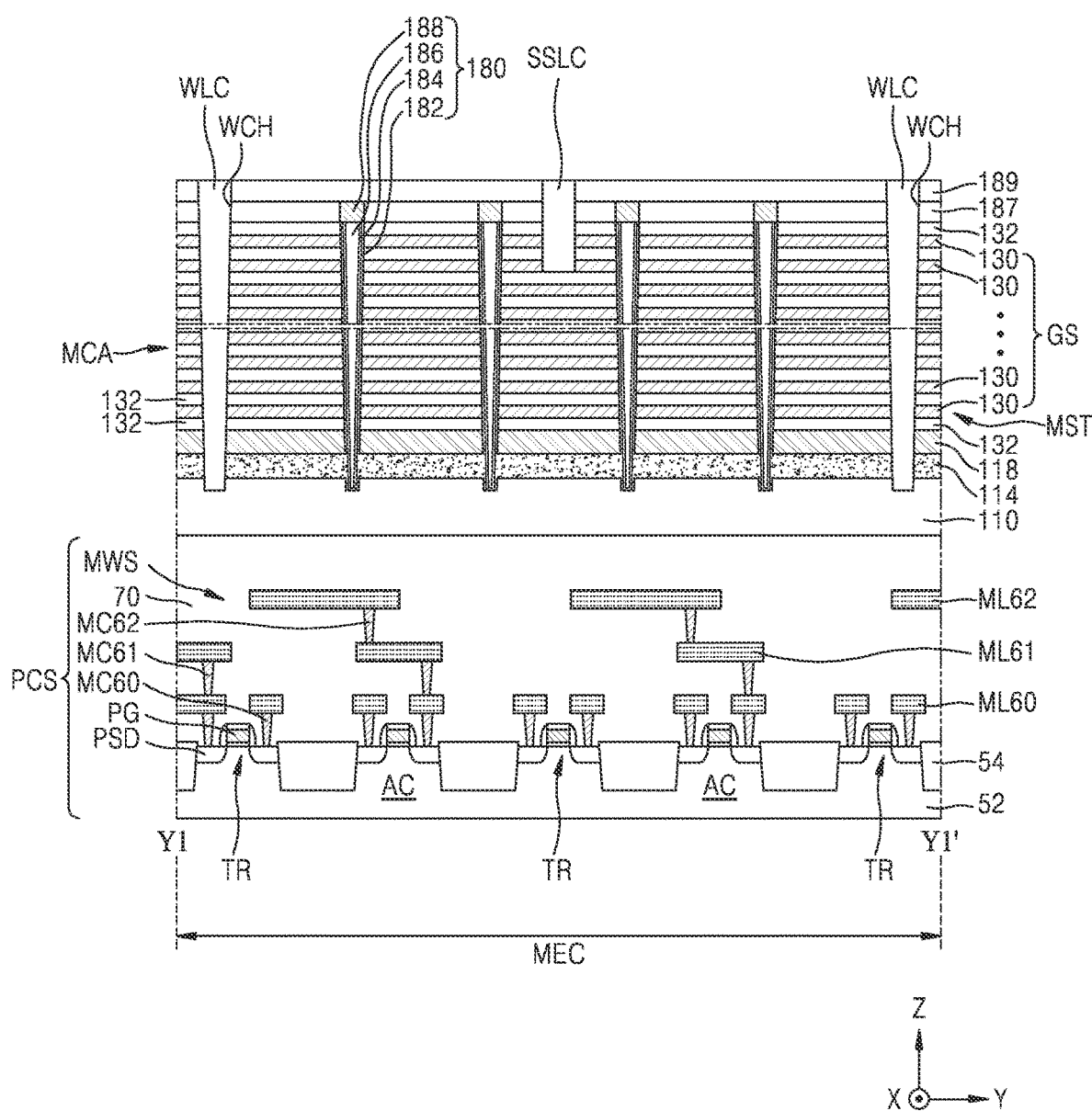
Figure 18A:
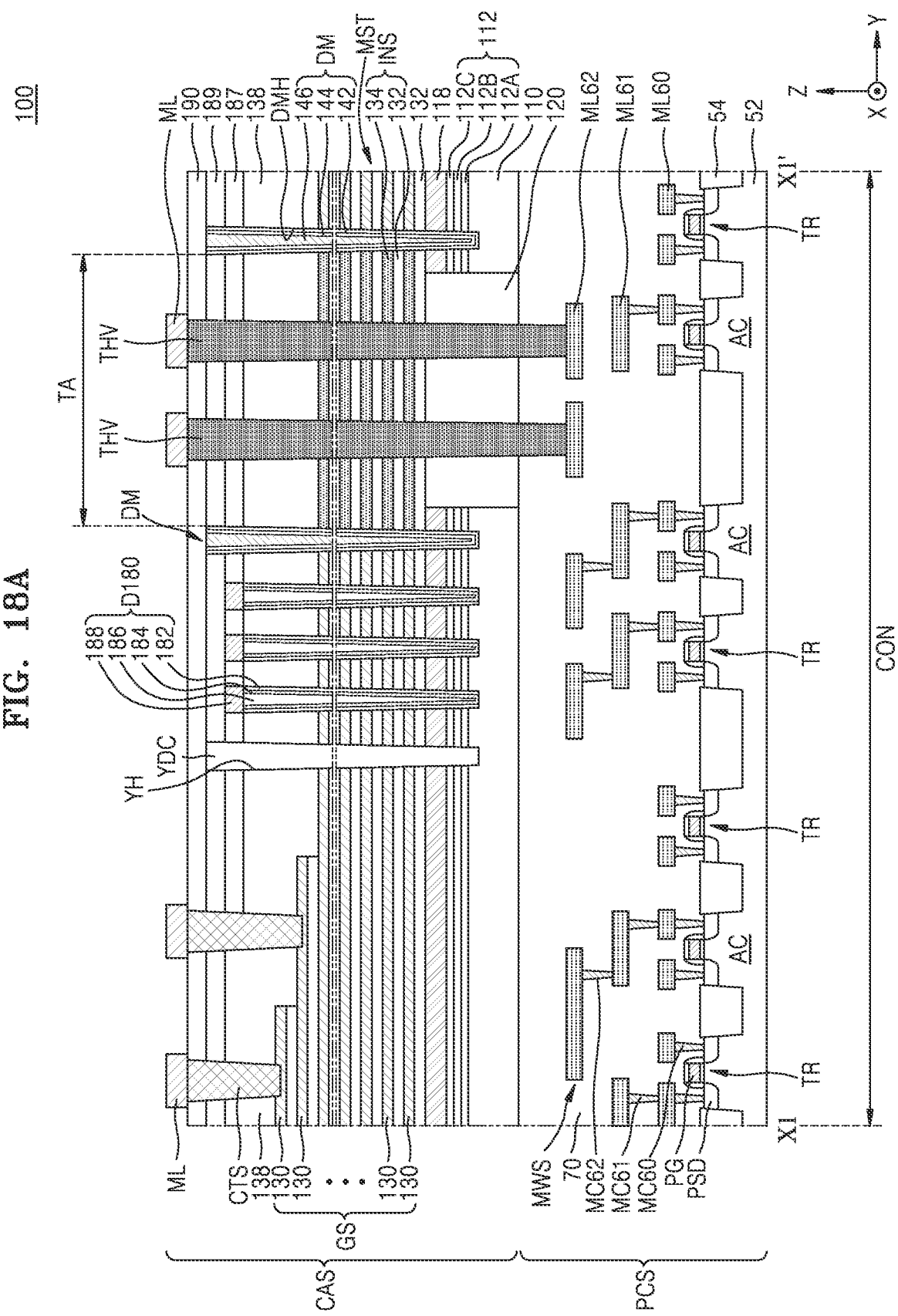
Figure 18B:
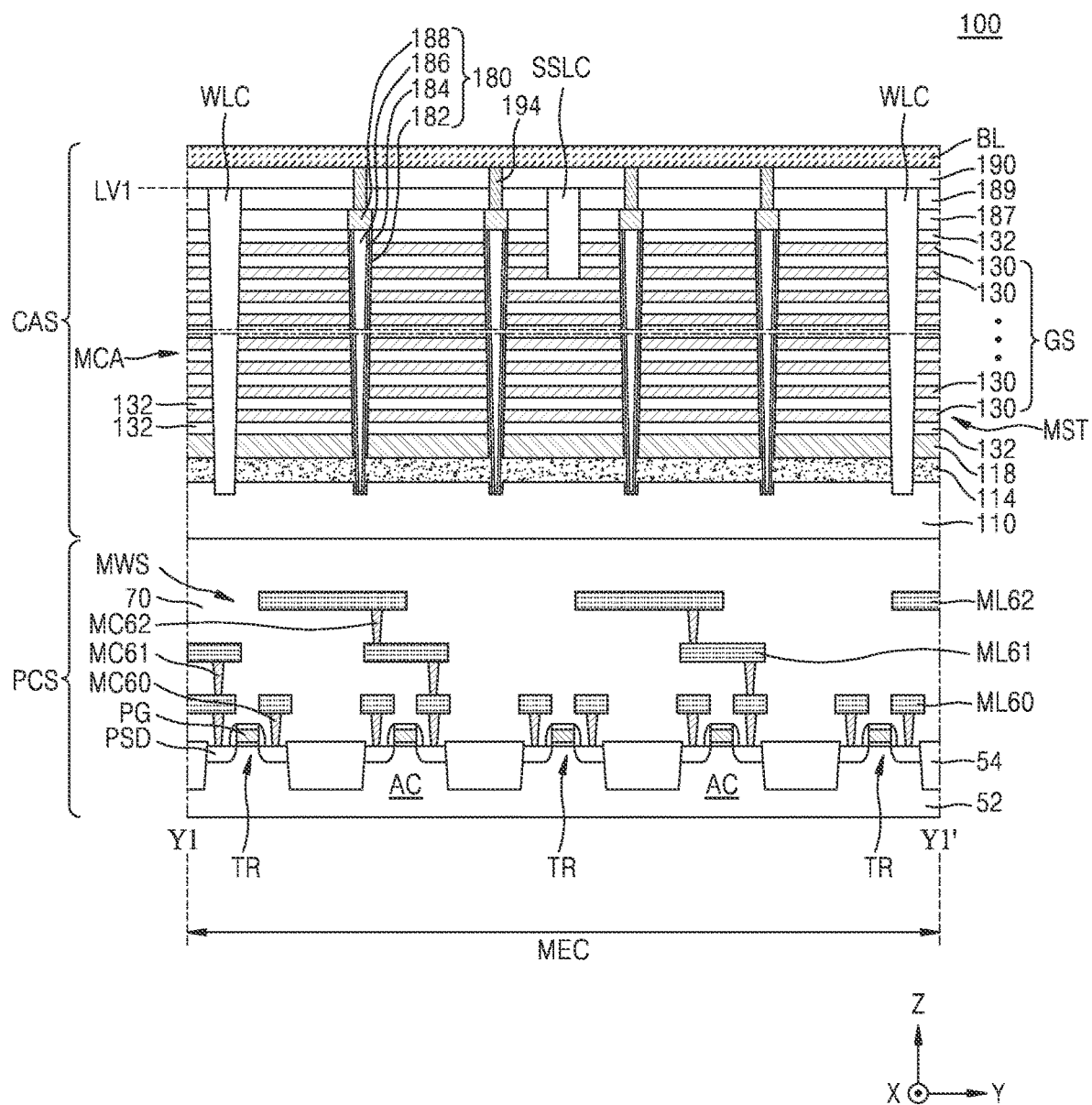

In a resultant structure obtained by performing a process described above with reference to FIGS. 16A and 16B, the plurality of intersection direction holes YH extending longitudinally in a second horizontal direction (a Y direction) may be formed near the dam structure DM in the connection region CON, and the first insulation liner 142, the second insulation liner 144, and the main plug 146 may be filled into the plurality of intersection direction holes YH. Therefore, the interlayer insulation layer 138 may be locally divided by the plurality of intersection direction holes YH in a peripheral region of the dam structure DM, and thus, a volume of the interlayer insulation layer 138 may be divided into several small portions. As a result, undesired stress caused by a relatively large volume of the interlayer insulation layer 138 may decrease near the dam structure DM. Therefore, undesired deformation, where a mold structure including the plurality of insulation layers 132 and the plurality of sacrificial insulation layers 134 collapses or falls down due to stress caused by the relatively large volume of the interlayer insulation layer 138, may be reduced or prevented near the dam structure DM while subsequent processes are being performed, and thus, a process defect caused by undesired deformation of the mold structure may be reduced or prevented. Referring to FIGS. 17A and 17B, in a state where a mask pattern (not shown) covers the plurality of dam structures DM in the connection region CON in a resultant structure of FIGS. 16A and 16B, the plurality of insulation layers 132, the plurality of sacrificial insulation layers 134, the second conductive plate 118, the insulation plate 112, and the upper substrate 110 may be exposed through the plurality of word line cut holes WCH and the plurality of intersection direction holes YH by removing the first insulation liner 142, the second insulation liner 144, and the main plug 146 in each of the plurality of word line cut holes WCH and the plurality of intersection direction holes YH in the memory cell region MEC and the connection region CON. In this case, the first insulation liner 142, the second insulation liner 144, and the main plug 146 in each of the plurality of dummy holes (not shown) for forming the plurality of dummy word line cut structures XDC1, XDC2, XDC3, and XDC4 illustrated in FIG. 5A in the connection region CON may also be removed. In example embodiments, the mask pattern may include a photoresist pattern.

An insulation plate 112 may be selectively removed through an inner space of each of the plurality of word line cut holes WCH and the plurality of intersection direction holes YH in only the memory cell region MEC among the memory cell region MEC and the connection region CON, and an empty space formed based thereon may be filled with a first conductive plate 114. While the insulation plate 112 is being removed in the memory cell region MEC, portions, which are adjacent to the insulation plate 112, of the gate dielectric layer 182 included in the channel structure 180 in the memory cell region MEC may be removed along with the insulation plate 112, and thus, the first conductive plate 114 may pass through a partial region of the gate dielectric layer 182 in a horizontal direction and may contact the channel region 184.

Also, the plurality of sacrificial insulation layers 134 may be substituted into the plurality of gate lines 130 through the inner space of each of the plurality of word line cut holes WCH and the plurality of intersection direction holes YH in the memory cell region MEC and the connection region CON. In this case, portions in the through via region TA surrounded by the dam structure DM among the plurality of sacrificial insulation layers 134 may be protected by the dam structure DM and may remain (e.g., may not be completely removed). The plurality of sacrificial insulation layers 134 and the plurality of insulation layers 132 each remaining in the through via region TA may form an insulation island INS.

After the first conductive plate 114 and the plurality of gate lines 130 are formed, the plurality of word line cut holes WCH may be filled with a plurality of word line cut structures WLC, and the plurality of intersection direction holes YH may be filled with a plurality of intersection direction cut structures YDC.

In a resultant structure obtained by performing a process described above with reference to FIGS. 17A and 17B, the plurality of intersection direction holes YH extending longitudinally in a second horizontal direction (a Y direction)

may be formed near the dam structure DM in the connection region CON, and the intersection direction cut structure YDC may be filled into the plurality of intersection direction holes YH. Therefore, the interlayer insulation layer 138 may be divided by the plurality of intersection direction holes YH in a peripheral region of the dam structure DM, and thus, a volume of the interlayer insulation layer 138 may be divided into several small portions, and structures near the plurality of intersection direction holes YH may be supported by the intersection direction cut structure YDC. As a result, undesired stress caused by a relatively large volume of the interlayer insulation layer 138 may decrease near the dam structure DM, and undesired deformation, where a memory stack structure MST including the plurality of insulation layers 132 and the plurality of gate lines 130 collapses or falls down due to stress caused by the relatively large volume of the interlayer insulation layer 138, may be reduced or prevented near the dam structure DM while subsequent processes are being performed Referring to FIGS. 18A and 18B, a third upper insulation layer 190 may be formed on the resultant structure of FIGS. 17A and 17B. A plurality of contact plugs 194, which pass through the third upper insulation layer 190 and the second upper insulation layer 189 and are connected to the plurality of channel structures 180, may be formed in the memory cell region MEC. Also, a plurality of contact structures CTS which pass through the third upper insulation layer 190, the second upper insulation layer 189, the first upper insulation layer 187, and the interlayer insulation layer 138 and are connected to edge portions of the plurality of gate lines 130 may be formed in the connection region CON. Subsequently, a plurality of bit lines BL may be formed on the plurality of contact plugs 194 in the memory cell region MEC, and a plurality of wiring layers ML may be formed on the plurality of through vias THV in the connection region CON, thereby manufacturing the semiconductor device 100 described above with reference to FIGS. 5A to 5E.

A method of manufacturing the semiconductor device 100 illustrated in FIGS. 5A to 5E has been described above with reference to FIGS. 13A to 18B, but it may be understood by those of ordinary skill in the art that the semiconductor devices 200, 300, 400, 500, 600, 700, 800, and 900 described above with reference to FIGS. 6 to 12B and semiconductor devices having various structures obtained through various modifications and changes therefrom within the scope of the inventive concept may be manufactured by performing various modifications and changes from the processes described above with reference to FIGS. 13A to 18B within the scope of the inventive concept.

Figure 19:
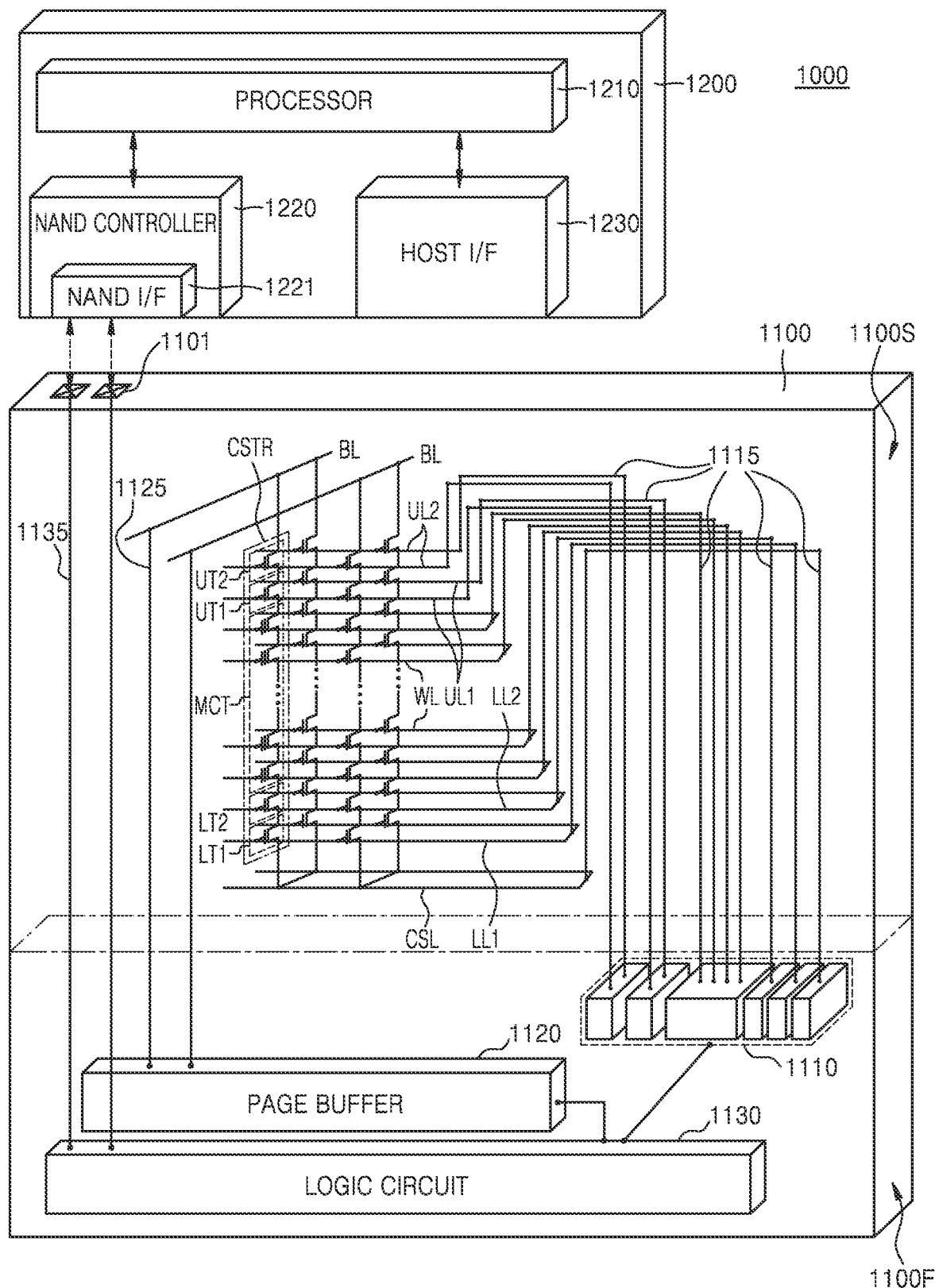
FIG. 19 is a diagram schematically illustrating an electronic system including a semiconductor device according to some embodiments of the inventive concept.

FIG. 19 is a schematic diagram illustrating an electronic system including a semiconductor device, according to some embodiments of the inventive concept.

Referring to FIG. 19, an electronic system 1000 according to some embodiments of the inventive concept may include a semiconductor device 1100 and a controller 1200 electrically connected to the semiconductor device 1100. The electronic system 1000 may include a storage device including one semiconductor device 1100 or a plurality of semiconductor devices 1100, or an electronic device including the storage device. For example, the electronic system 1000 may include a solid state drive (SSD) device, a universal serial bus (USB), a computing system, a medical device, or a communication device, which includes at least one semiconductor device 1100.

The semiconductor device 1100 may include a nonvolatile memory device. For example, the semiconductor device 1100 may include a NAND flash memory device including at least one of the structures described above regarding the semiconductor devices 100, 200, 300, 400, 500, 600, 700, 800, and 900 which have been described with reference to FIGS. 4 to 12B. The semiconductor device 1100 may include a first structure 1100F and a second structure 1100S on the first structure 1100F. In example embodiments, the first structure 1100F may be arranged beside the second structure 1100S. The first structure 1100F may be a peripheral circuit structure including a decoder circuit 1110, a page buffer 1120, and a logic circuit 1130. The second structure 1100S may be a memory cell structure including a bit line BL, a common source line CSL, a plurality of word lines WL, first and second gate upper lines UL1 and UL2, first and second gate lower lines LL1 and LL2, and a plurality of memory cell strings CSTR between the bit line BL and the common source line CSL.

In the second structure 1100S, each of the plurality of memory cell strings CSTR may include lower transistors LT1 and LT2 adjacent to the common source line CSL, upper transistors UT1 and UT2 adjacent to the bit line BL, and a plurality of memory cell transistors MCT between the lower transistors LT1 and LT2 and the upper transistors UT1 and UT2. The number of lower transistors LT1 and LT2 and the number of upper transistors UT1 and UT2 may be variously modified according to embodiments.

In example embodiments, the upper transistors UT1 and UT2 may each include a string select transistor, and the lower transistors LT1 and LT2 may each include a ground select transistor. A plurality of gate lower lines LL1 and LL2 may be gate electrodes of the lower transistors LT1 and LT2, respectively. A word line WL may be a gate electrode of a memory cell transistor MCT, and the gate upper lines UL1 and UL2 may be gate electrodes of the upper transistors UT1 and UT2, respectively.

The common source line CSL, the plurality of gate upper lines LL1 and LL2, the plurality of word lines WL, and the plurality of gate upper lines UL1 and UL2 may be electrically connected to the decoder circuit 1110 via a plurality of first connection wiring lines 1115, which extend from inside the first structure 1100F to the second structure 1100S. A plurality of bit lines BL may be electrically connected to the page buffer 1120 via a plurality of second connection wiring lines 1125, which extend from inside the first structure 1100F to the second structure 1100S.

In the first structure 1100F, the decoder circuit 1110 and the page buffer 1120 may perform a control operation on at least one of the plurality of memory cell transistors MCT. The decoder circuit 1110 and the page buffer 1120 may be controlled by the logic circuit 1130.

The semiconductor device 1100 may communicate with the controller 1200 via an input/output pad 1101 electrically connected to the logic circuit 1130. The input/output pad 1101 may be electrically connected to the logic circuit 1130 via an input/output connection wiring line 1135, which extends from inside the first structure 1100F to the second structure 1100S.

The controller 1200 may include a processor 1210, a NAND controller 1220, and a host interface 1230. In example embodiments, the electronic system 1000 may include a plurality of semiconductor devices 1100, and in this case, the controller 1200 may control the plurality of semiconductor devices 1100.

The processor 1210 may control overall operations of the electronic system 1000 including the controller 1200. The processor 1210 may be operated according to certain firmware and may access the semiconductor device 1100 by controlling the NAND controller 1220. The NAND controller 1220 may include a NAND interface 1221 that processes communication with the semiconductor device 1100. Via the NAND interface 1221, a control command for controlling the semiconductor device 1100, data intended to be written to the plurality of memory cell transistors MCT of the semiconductor device 1100, data intended to be read from the plurality of memory cell transistors MCT of the semiconductor device 1100, and the like may be transmitted. The host interface 1230 may provide a function of communication between the electronic system 1000 and an external host. When receiving a control command from the external host via the host interface 1230, the processor 1210 may control the semiconductor device 1100 in response to the control command.

Figure 20:
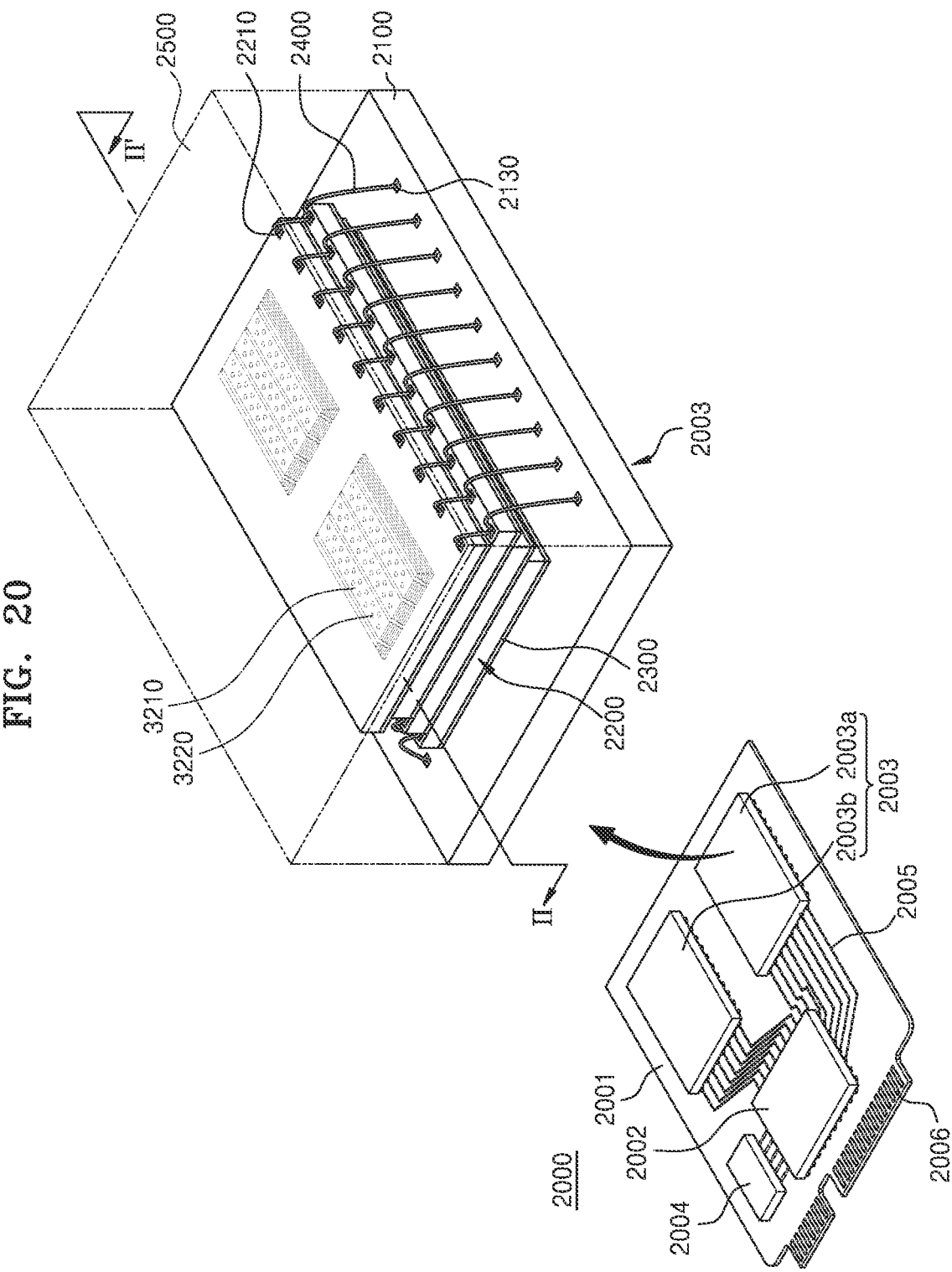
FIG. 20 is a perspective view schematically illustrating an electronic system including a semiconductor device according to some embodiments of the inventive concept.

FIG. 20 is a schematic perspective view illustrating an electronic system including a semiconductor device, according to some embodiments of the inventive concept.

Referring to FIG. 20, an electronic system 2000 according to example embodiments of the inventive concept may include a main substrate 2001, a controller 2002 mounted on the main substrate 2001, one or more semiconductor packages 2003, and DRAM 2004. The semiconductor packages 2003 and the DRAM 2004 may be connected to the controller 2002 by a plurality of wiring patterns 2005 formed on the main substrate 2001.

The main substrate 2001 may include a connector 2006 including a plurality of pins to be coupled to an external host. The number and arrangement of the plurality of pins in the connector 2006 may vary according to a communication interface between the electronic system 2000 and the external host. In example embodiments, the electronic system 2000 may communicate with the external host according to one of interfaces such as Universal Serial Bus (USB), Peripheral Component Interconnect Express (PCI-Express), Serial Advanced Technology Attachment (SATA), and M-Phy for Universal Flash Storage (UFS). In example embodiments, the electronic system 2000 may be operated by power supplied from the external host via the connector 2006. The electronic system 2000 may further include a power management integrated circuit (PMIC) distributing the power, which is supplied from the external host, to the controller 2002 and the semiconductor packages 2003.

The controller 2002 may write data to or read data from the semiconductor packages 2003 and may improve an operation speed of the electronic system 2000.

The DRAM 2004 may be a buffer memory for alleviating a speed difference between the external host and the semiconductor packages 2003, which are data storage spaces. The DRAM 2004 included in the electronic system 2000 may also operate as a kind of cache memory and may provide a space for temporarily storing data in a control operation on the semiconductor packages 2003. When the DRAM 2004 is included in the electronic system 2000, the controller 2002 may further include a DRAM controller for controlling the DRAM 2004, in addition to a NAND controller for controlling the semiconductor packages 2003.

The semiconductor packages 2003 may include first and second semiconductor packages 2003a and 2003b, which are spaced apart from each other. Each of the first and second semiconductor packages 2003a and 2003b may be a semiconductor package including a plurality of semiconductor chips 2200. Each of the first and second semiconductor packages 2003a and 2003b may include a package substrate 2100, the plurality of semiconductor chips 2200 on the package substrate 2100, an adhesive layer 2300 on a lower surface of each of the plurality of semiconductor chips 2200, a connection structure 2400 electrically connecting the plurality of semiconductor chips 2200 to the package substrate 2100, and a molding layer 2500 arranged on the package substrate 2100 to cover the plurality of semiconductor chips 2200 and the connection structure 2400.

The package substrate 2100 may include, for example, a printed circuit board including a plurality of package upper pads 2130. Each of the plurality of semiconductor chips 2200 may include an input/output pad 2210. The input/output pad 2210 may correspond to the input/output pad 1101 of FIG. 19. Each of the plurality of semiconductor chips 2200 may include a plurality of gate stacks 3210 and a plurality of channel structures 3220. Each of the plurality of semiconductor chips 2200 may include at least one of the semiconductor devices 100, 200, 300, 400, 500, 600, 700, 800, and 900 described with reference to FIGS. 4 to 12B.

In example embodiments, the connection structure 2400 may include a bonding wire electrically connecting the input/output pad 2210 to a package upper pad 2130. Accordingly, in the first and second semiconductor packages 2003a and 2003b, the plurality of semiconductor chips 2200 may be electrically connected to each other in a bonding wire manner and may be electrically connected to the package upper pads 2130 of the package substrate 2100. In example embodiments, in the first and second semiconductor packages 2003a and 2003b, the plurality of semiconductor chips 2200 may be electrically connected to each other by a connection structure including a through-silicon via (TSV) rather than by the connection structure 2400 of the bonding wire type.

In example embodiments, the controller 2002 and the plurality of semiconductor chips 2200 may be included in one package. In example embodiments, the controller 2002 and the plurality of semiconductor chips 2200 may be mounted on a separate interposer substrate, which is different from the main substrate 2001, and may be connected to each other by wiring lines formed on the interposer substrate.

Figure 21:
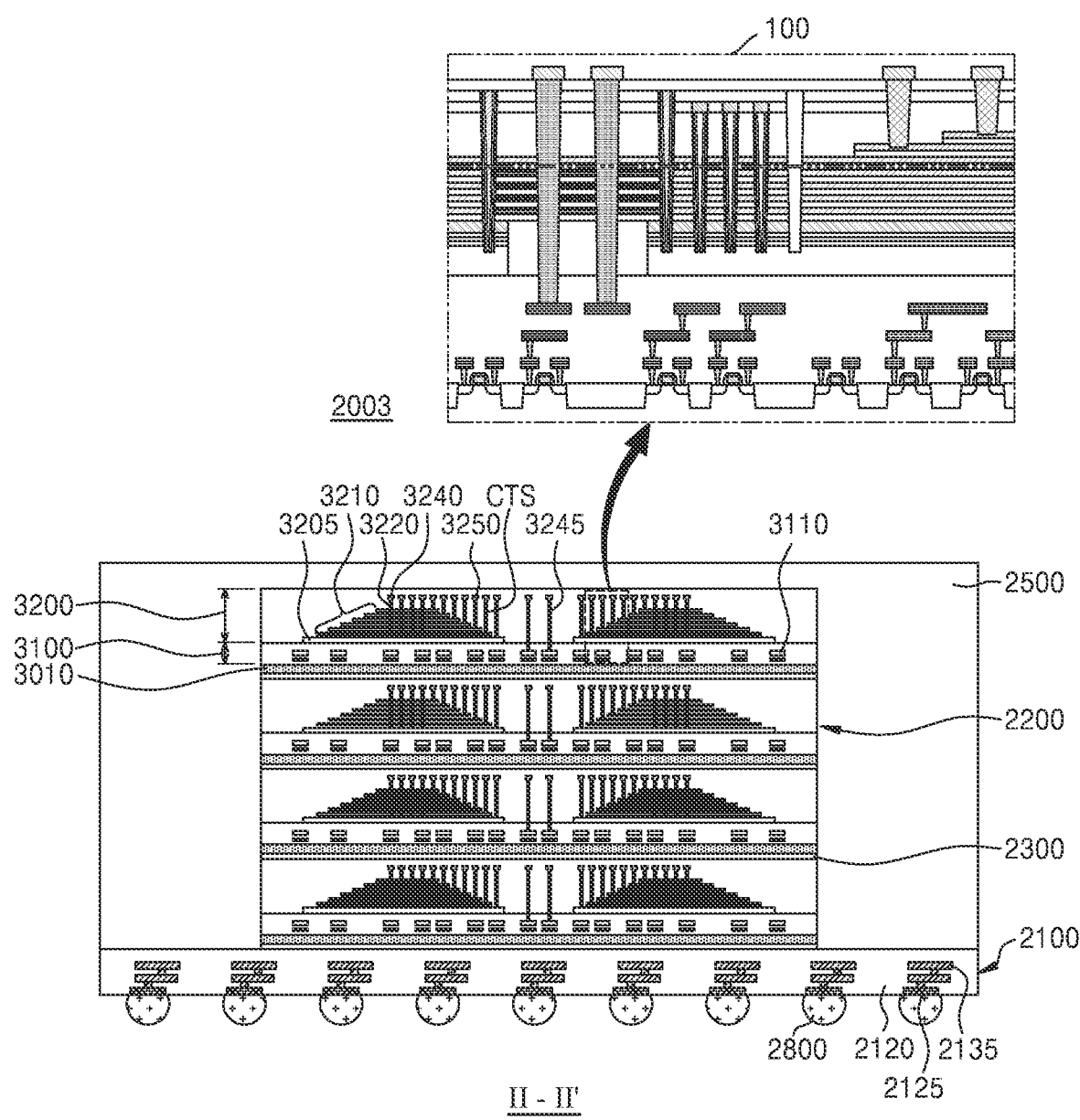
FIG. 21 is a cross-sectional view schematically illustrating semiconductor packages according to some embodiments of the inventive concept.

FIG. 21 is a schematic cross-sectional view illustrating a semiconductor package according to some embodiments of the inventive concept. FIG. 21 illustrates a configuration corresponding to a cross-section taken along a line II-II' of FIG. 20, in more detail.

Referring to FIG. 21, in the semiconductor package 2003, the package substrate 2100 may include, for example, a printed circuit board. The package substrate 2100 may include a package substrate body 2120, the plurality of package upper pads 2130 (see FIG. 20) arranged on an upper surface of the package substrate body 2120, a plurality of lower pads 2125 arranged on or exposed by a lower surface of the package substrate body 2120, and a plurality of internal wiring lines 2135 arranged inside the package substrate body 2120 to electrically connect the plurality of package upper pads 2130 to the plurality of lower pads 2125. The plurality of package upper pads 2130 may be electrically connected to a plurality of connection structures 2400. The plurality of lower pads 2125 may be connected to the plurality of wiring patterns 2005 on the main substrate 2001 of the electronic system 2000, which is shown in FIG. 20, via a plurality of conductive connection units 2800.

Each of the plurality of semiconductor chips 2200 may include a semiconductor substrate 3010, a first structure 3100, and a second structure 3200, the first structure 3100 and the second structure 3200 being sequentially stacked on the semiconductor substrate 3010 in the stated order. The first structure 3100 may include a peripheral circuit area including a plurality of peripheral wiring lines 3110. The second structure 3200 may include a common source line 3205, a gate stack 3210 on the common source line 3205, a channel structure 3220 penetrating the gate stack 3210, and a bit line 3240 electrically connected to the channel structure 3220. In example embodiments, each of the plurality of semiconductor chips 2200 may include substantially the same elements as those of the semiconductor device 100 described above with reference to FIGS. 4 and 5A to 5E.

Each of the plurality of semiconductor chips 2200 may include a through-wiring line 3245, which is electrically connected to the plurality of peripheral wiring lines 3110 of the first structure 3100 and extends into the second structure 3200. The through-wiring line 3245 may be arranged outside the gate stack 3210. In some example embodiments, the semiconductor package 2003 may further include a through-wiring line penetrating the gate stack 3210. Each of the plurality of semiconductor chips 2200 may include an input/output pad (2210 of FIG. 20) electrically connected to the plurality of peripheral wiring lines 3110 of the first structure 3100. Each of the plurality of semiconductor chips 2200 may also include contact structures CTS.

While the inventive concept has been particularly shown and described with reference to some example embodiments thereof, it will be understood that various changes in form and details may be made therein without departing from the scope of the following claims.

What is claimed is:

1. A semiconductor device comprising:
   a peripheral circuit structure;
   a substrate on the peripheral circuit structure;
   a pair of word line cut structures extending longitudinally in a first horizontal direction on the substrate, the pair of word line cut structures being spaced apart from each other in a second horizontal direction that is perpendicular to the first horizontal direction; and
   a memory cell block that is between the pair of word line cut structures and on the substrate,
   wherein the memory cell block comprises:
      a memory stack structure including a plurality of gate lines overlapping each other in a vertical direction;
      an interlayer insulation layer on an edge portion of each of the plurality of gate lines;
      a dam structure extending through the memory stack structure and the interlayer insulation layer;
      an intersection direction cut structure extending through the memory stack structure and the interlayer insulation layer in the vertical direction and extending longitudinally in a horizontal direction that traverses the first horizontal direction, the intersection direction cut structure being spaced apart from the dam structure in the first horizontal direction; and
      a plurality of dummy channel structures between the intersection direction cut structure and the dam structure.

2. The semiconductor device of claim 1, wherein the intersection direction cut structure comprises a cut line having a linear shape extending in the second horizontal direction.

3. The semiconductor device of claim 1, wherein the intersection direction cut structure comprises a cut line having a nonlinear shape.

4. The semiconductor device of claim 1, wherein the intersection direction cut structure comprises a plurality of cut lines that are aligned along and spaced apart from one another in the second horizontal direction.

5. The semiconductor device of claim 1, further comprising a dummy word line cut structure extending through the memory stack structure and the interlayer insulation layer in the vertical direction and extending longitudinally in the first horizontal direction, the dummy word line cut structure being between the dam structure and the intersection direction cut structure,
   wherein the plurality of dummy channel structures comprise a first dummy channel structure and a second dummy channel structure spaced apart from each other with the dummy word line cut structure therebetween.

6. The semiconductor device of claim 1, further comprising a plurality of dummy word line cut structures extending through the memory stack structure and the interlayer insulation layer in the vertical direction, the plurality of dummy word line cut structures being spaced apart from one another in the second horizontal direction,
   wherein the plurality of dummy word line cut structures are between the memory cell block and the intersection direction cut structure.

7. The semiconductor device of claim 1, further comprising a dummy word line cut structure between a first word line cut structure of the pair of word line cut structures and the dam structure, the dummy word line cut structure extending through the memory stack structure and the interlayer insulation layer in the vertical direction and extending longitudinally in the first horizontal direction along a sidewall of the dam structure.

8. The semiconductor device of claim 1, wherein each of the pair of word line cut structures comprises an insulation structure,
   the intersection direction cut structure comprises a first insulation layer, and
   the dam structure comprises a second insulation layer and a polysilicon layer.

9. The semiconductor device of claim 1, wherein each of the pair of word line cut structures comprises an insulation structure, and
   each of the intersection direction cut structure and the dam structure comprises an insulation layer and a polysilicon layer.

10. The semiconductor device of claim 1, wherein each of the intersection direction cut structure and the pair of word line cut structures comprises a first insulation layer and a metal layer, and
    the dam structure comprises a second insulation layer and a polysilicon layer.

11. The semiconductor device of claim 1, further comprising:
    an insulation island that is in the dam structure and is spaced apart from the plurality of gate lines with the dam structure therebetween; and
    a through via extending through the insulation island in the vertical direction, the through via being electrically connected to one circuit of the peripheral circuit structure.

12. The semiconductor device of claim 1, further comprising:
    a plurality of channel structures extending through the plurality of gate lines in the vertical direction; and
    a plurality of bit lines extending longitudinally in the second horizontal direction on the plurality of channel structures,
    wherein the intersection direction cut structure extends parallel to the plurality of bit lines.

13. A semiconductor device comprising:
    a peripheral circuit structure;

a memory stack structure including a plurality of gate lines overlapping the peripheral circuit structure in a vertical direction;

an interlayer insulation layer on an edge portion of each of the plurality of gate lines;

a dam structure extending through the memory stack structure and the interlayer insulation layer in the vertical direction and defining a through via region in the memory stack structure;

an intersection direction cut structure extending through the memory stack structure and the interlayer insulation layer in the vertical direction, the intersection direction cut structure being spaced apart from the dam structure in a first horizontal direction and extending longitudinally in a second horizontal direction that traverses the first horizontal direction; and a plurality of dummy channel structures between the intersection direction cut structure and the dam structure.

14. The semiconductor device of claim 13, wherein the intersection direction cut structure comprises a plurality of linear cut lines aligned with and spaced apart from one another in a third horizontal direction that is perpendicular to the first horizontal direction.

15. The semiconductor device of claim 13, wherein the intersection direction cut structure comprises a plurality of nonlinear cut lines aligned with and spaced apart from one another in a third horizontal direction that is perpendicular to the first horizontal direction.

16. The semiconductor device of claim 13, wherein the intersection direction cut structure and the dam structure comprise the same material.

17. The semiconductor device of claim 13, wherein the plurality of dummy channel structures extend through the memory stack structure and the interlayer insulation layer in the vertical direction.

18. The semiconductor device of claim 13, further comprising a through via extending through the through via region in the vertical direction, the through via being electrically connected to one circuit of the peripheral circuit structure.

19. An electronic system comprising:

a main substrate;

a semiconductor device on the main substrate; and a controller electrically connected to the semiconductor device, on the main substrate, wherein the semiconductor device comprises:

a peripheral circuit structure;

a memory stack structure including a plurality of gate lines overlapping the peripheral circuit structure in a vertical direction;

an interlayer insulation layer on an edge portion of each of the plurality of gate lines;

a dam structure extending through the plurality of gate lines and the interlayer insulation layer in the vertical direction and defining a through via region in the memory stack structure;

an intersection direction cut structure extending through the memory stack structure and the interlayer insulation layer in the vertical direction, the intersection direction cut structure being spaced apart from the dam structure in a first horizontal direction and extending longitudinally in a second horizontal direction that traverses the first horizontal direction;

a plurality of dummy channel structures between the intersection direction cut structure and the dam structure; and an input/output pad electrically connected to the peripheral circuit structure.

20. The electronic system of claim 19, wherein the main substrate further comprises a plurality of wiring patterns electrically connecting the semiconductor device to the controller, and the intersection direction cut structure comprises a plurality of cut lines that are aligned with and spaced apart from one another in a third horizontal direction that is perpendicular to the first horizontal direction.

* * * * *